United States Patent [19]
Kikuda

[11] Patent Number: 5,903,575
[45] Date of Patent: May 11, 1999

[54] SEMICONDUCTOR MEMORY DEVICE HAVING FAST DATA WRITING MODE AND METHOD OF WRITING TESTING DATA IN FAST DATA WRITING MODE

[75] Inventor: Shigeru Kikuda, Hyogo-ken, Japan

[73] Assignee: Mitsubishi Denki Kabushiki Kaisha, Tokyo, Japan

[21] Appl. No.: 08/158,837

[22] Filed: Nov. 29, 1993

Related U.S. Application Data

[63] Continuation of application No. 07/638,251, Jan. 7, 1991, abandoned.

[30] Foreign Application Priority Data

Jan. 8, 1990 [JP] Japan .......................................... 2-2286

[51] Int. Cl.$^6$ .................................................. G11C 29/00
[52] U.S. Cl. .......................................... 371/21.2; 365/201
[58] Field of Search .................................. 371/21.1, 21.2, 371/21.6, 10.1, 10.2, 10.3; 364/245.3, 268.3, 268, 943.91, 944.2, 964.6, 965.3; 365/201, 220

[56] References Cited

U.S. PATENT DOCUMENTS

| | | | |
|---|---|---|---|
| 4,464,750 | 8/1984 | Tatematsu | 371/21 |
| 4,601,031 | 7/1986 | Walker et al. | 371/10.3 |
| 4,667,330 | 5/1987 | Kumagai | 371/21.1 |
| 4,670,878 | 6/1987 | Childers | 371/21 |
| 4,745,582 | 5/1988 | Fukushi et al. | 365/201 |
| 4,817,056 | 3/1989 | Furutani et al. | 365/201 |
| 4,833,652 | 5/1989 | Isobe et al. | 365/201 |
| 4,860,260 | 8/1989 | Saito et al. | 371/21.1 |
| 4,888,772 | 12/1989 | Tanigawa | 371/21.2 |
| 5,060,230 | 10/1991 | Arimoto et al. | 371/21.2 |
| 5,140,553 | 8/1992 | Choi et al. | 365/201 |
| 5,208,778 | 5/1993 | Kumanoya et al. | 371/21.1 |
| 5,299,161 | 3/1994 | Choi et al. | 365/201 |

FOREIGN PATENT DOCUMENTS

| | | |
|---|---|---|
| 63-177394 | 7/1988 | Japan . |
| L01-143093 | 6/1989 | Japan . |

OTHER PUBLICATIONS

"Parallel Testing Technology For VLSI Memories", 1987 International Test Conference, by Jun'ichi Inoue, pp. 1066–1071.

"1989 Digest IEEE International Solid–State Circuit Conference", by Kazutami Arimoto et al, pp. 244–245 and 352.

Primary Examiner—Trinh L. Tu
Attorney, Agent, or Firm—McDermott, Will & Emery

[57] ABSTRACT

Disclosed is a semiconductor memory device including a normal memory array and preliminary memory array enabling a mutual data transfer. Word lines in the normal memory array and those in the preliminary memory array are controlled by separate row decoders and separate word drivers. Bit lines and sense amplifiers are provided commonly to the normal memory array and the preliminary memory array. When test data is written in a predetermined pattern into the normal memory array, data corresponding to the predetermined pattern is written in advance for each memory cell in the preliminary memory array. Then, after the row decoder and word driver for the preliminary memory array are enabled so that the word lines in the preliminary memory array are activated, the row decoder and word driver for the normal memory array are enabled so that the word lines in the preliminary memory array are activated. Thus, data signals read from memory cells of one row in the normal memory array are simultaneously amplified by the sense amplifiers via the bit lines and then transferred via the bit lines to memory cells of one row in the preliminary memory array. In this result, the test data are written at one time into the memory cells of one row in the normal memory array.

23 Claims, 15 Drawing Sheets

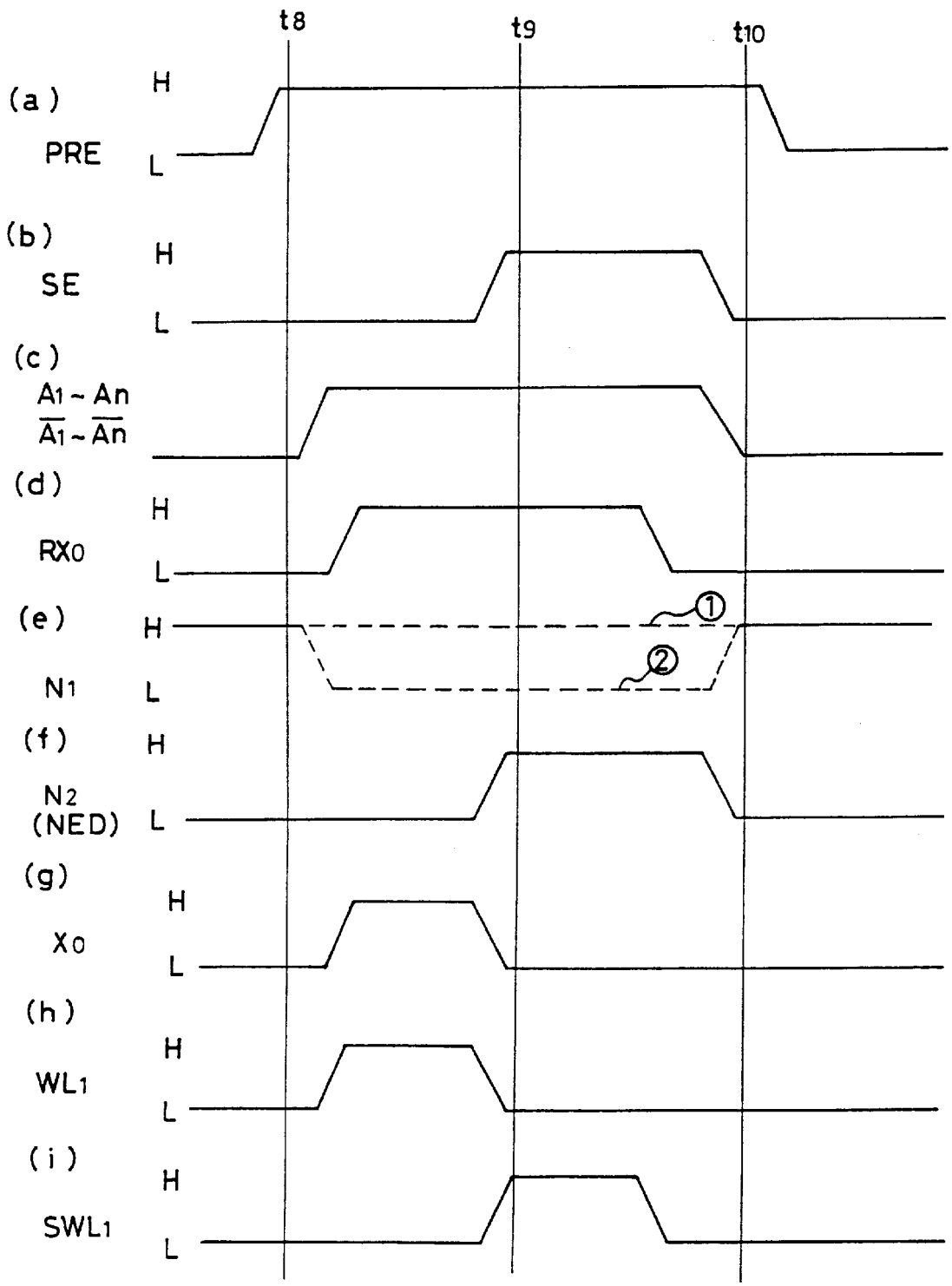

FIG.6(a)

ROW ADDRESS →

↓ COLUMN ADDRESS

| 1 | 1 | 1 | 1 | 1 | 1 |
|---|---|---|---|---|---|
| 1 | 1 | 1 | 1 | 1 | 1 |
| 1 | 1 | 1 | 1 | 1 | 1 |
| 1 | 1 | 1 | 1 | 1 | 1 |
| 1 | 1 | 1 | 1 | 1 | 1 |
| 1 | 1 | 1 | 1 | 1 | 1 |

FIG.6(b)

ROW ADDRESS →

↓ COLUMN ADDRESS

| 0 | 0 | 0 | 0 | 0 | 0 |
|---|---|---|---|---|---|
| 0 | 0 | 0 | 0 | 0 | 0 |
| 0 | 0 | 0 | 0 | 0 | 0 |
| 0 | 0 | 0 | 0 | 0 | 0 |
| 0 | 0 | 0 | 0 | 0 | 0 |
| 0 | 0 | 0 | 0 | 0 | 0 |

FIG.6(c)

ROW ADDRESS →

COLUMN ADDRESS ↓

| 1 | 0 | 1 | 0 | 1 | 0 |
|---|---|---|---|---|---|
| 1 | 0 | 1 | 0 | 1 | 0 |
| 1 | 0 | 1 | 0 | 1 | 0 |
| 1 | 0 | 1 | 0 | 1 | 0 |
| 1 | 0 | 1 | 0 | 1 | 0 |
| 1 | 0 | 1 | 0 | 1 | 0 |

FIG.6(d)

ROW ADDRESS →

COLUMN ADDRESS ↓

| 1 | 1 | 1 | 1 | 1 | 1 |
|---|---|---|---|---|---|
| 0 | 0 | 0 | 0 | 0 | 0 |
| 1 | 1 | 1 | 1 | 1 | 1 |
| 0 | 0 | 0 | 0 | 0 | 0 |
| 1 | 1 | 1 | 1 | 1 | 1 |
| 0 | 0 | 0 | 0 | 0 | 0 |

FIG. 6(e)

ROW ADDRESS →

| 1 | 0 | 1 | 0 | 1 | 0 |
|---|---|---|---|---|---|
| 0 | 1 | 0 | 1 | 0 | 1 |
| 1 | 0 | 1 | 0 | 1 | 0 |
| 0 | 1 | 0 | 1 | 0 | 1 |
| 1 | 0 | 1 | 0 | 1 | 0 |
| 0 | 1 | 0 | 1 | 0 | 1 |

← COLUMN ADDRESS

FIG. 6(f)

ROW ADDRESS →

| 0 | 1 | 0 | 1 | 0 | 1 |
|---|---|---|---|---|---|
| 0 | 1 | 0 | 1 | 0 | 1 |
| 1 | 0 | 1 | 0 | 1 | 0 |
| 1 | 0 | 1 | 0 | 1 | 0 |
| 0 | 1 | 0 | 1 | 0 | 1 |
| 0 | 1 | 0 | 1 | 0 | 1 |

← COLUMN ADDRESS

FIG.9(a)

ROW ADDRESS →

↕ COLUMN ADDRESS

| 1 | 1 | 0 | 0 | 1 | 1 |
|---|---|---|---|---|---|
| 1 | 1 | 0 | 0 | 1 | 1 |
| 0 | 0 | 1 | 1 | 0 | 0 |
| 0 | 0 | 1 | 1 | 0 | 0 |
| 1 | 1 | 0 | 0 | 1 | 1 |
| 1 | 1 | 0 | 0 | 1 | 1 |

FIG.9(b)

ROW ADDRESS →

↕ COLUMN ADDRESS

| 1 | 1 | 1 | 1 | 1 | 1 |
|---|---|---|---|---|---|
| 1 | 0 | 1 | 1 | 0 | 1 |
| 1 | 1 | 1 | 1 | 1 | 1 |
| 0 | 0 | 0 | 0 | 0 | 0 |
| 0 | 1 | 0 | 0 | 1 | 0 |
| 0 | 0 | 0 | 0 | 0 | 0 |

SEMICONDUCTOR MEMORY DEVICE HAVING FAST DATA WRITING MODE AND METHOD OF WRITING TESTING DATA IN FAST DATA WRITING MODE

This application is a continuation of application Ser. No. 07/638,251 filed Jan. 7, 1991, now abandoned.

BACKGROUND OF THE INVENTION

1. Field of the Invention

The present invention relates generally to semiconductor memory devices and, more particularly, to a semiconductor memory device capable of reducing the time required for a functional testing of an internal circuit.

2. Description of the Background Art

As the capacity of a semiconductor memory device increases, an increase in the test time required for a functional testing of an internal circuit becomes a significant problem. Parallel testing technology for reducing the functional testing time of VLSI memories is proposed in the article by J. Inoue et al, entitled "PARALLEL TESTING TECHNOLOGY FOR VLSI MEMORIES", 1987 ITC Proceedings, pp. 1066–1071. In this parallel testing technology, all memory cells connected to one word line are tested at a time by adopting an on-chip testing circuit system in which a testing circuit for performing a functional testing of a memory and a tested circuit are mounted on a common chip.

FIG. 12 is a schematic block diagram showing the configuration of a memory including an on-chip testing circuit disclosed in the above-described document, which is a circuit for testing provided on the same chip as that of a tested circuit.

Referring to FIG. 12, a memory array 10 includes a plurality of bit line pairs, a plurality of word lines crossing the bit line pairs, and memory cells provided one for each of cross-over points between the bit lines and the word lines.

In this memory, in normal data writing, a data input circuit 101 receives externally applied data $D_{IN}$. An externally applied address signal is applied via an address buffer 106 to a column decoder 104 and a row decoder 108. Column decoder 104 decodes the applied address signal to select a bit line connected to memory cells corresponding to the applied address signal. Row decoder 107 decodes the applied address signal, to select a word line connected to memory cells corresponding to the applied address signal. A word driver 108 activates the word line selected by row decoder 107 so as to enable data writing/reading relative to the memory cells connected to the selected word line. Then, the data received by data input circuit 101 is written via a multiplexer 103 into a memory cell provided in correspondence with the cross-over point between the bit line selected by column decoder 104 and the word line activated by word driver 108.

In normal data reading, column decoder 104 and row decoder 107 select a bit line and a word line, respectively, corresponding to an address signal applied through address buffer 106. Word driver 108 activates the word line selected by row decoder 107 similarly to the case of normal data writing. Accordingly, in response to storage data of a memory cell provided corresponding to the cross-over point between the bit line selected by column decoder 104 and the word line selected by row decoder 107, the potential of the selected bit line rises (when the storage data is logical high or an H level) or falls (when the storage data is logical low or an L level).

When no data reading/writing is carried out, two bit lines constituting each bit line pair is equalized at a predetermined potential (in general, $V_{cc}/2$, ½of a supply potential). In data reading, the potential of the selected bit line rises or falls from the predetermined potential $V_{cc}/2$ in response to the storage data of the selected memory cell. A sensing circuit 105 comprises differential amplifier circuits each receiving as inputs the respective potentials of the two bit lines constituting each bit line pair.

More specifically, when the potential of a bit line connected to the selected memory cell rises higher than the potential obtained in equalization, sensing circuit 105 raises the potential of this bit line to a high potential (supply potential) corresponding to a high logic level or the H level and simultaneously lowers the potential of the other bit line paired with this bit line to a low potential (ground potential) corresponding to a low logic level or the L level. Conversely, when the potential of the bit line connected to the selected memory cell falls lower than the potential obtained in equalization, sensing circuit 105 lowers the potential of this bit line to a low potential corresponding to the L level and simultaneously raises the potential of the other bit line paired with this bit line to a high potential corresponding to the H level. As a result, complementary data associated with the storage data of the selected memory cell is read onto the selected bit line and the other bit line paired therewith.

In normal data reading, as the result that sensing circuit 105 performs the foregoing operation, a potential appearing on the bit line connected to the selected memory cell, (which is the bit line selected by column decoder 104) is transmitted as the storage data of the selected memory cell via multiplexer 103 to a data output circuit 102. Data output circuit 102 outputs the data from multiplexer 103 as final read data $D_{OUT}$.

A determination is made as to the presence/absence of defects of memory cells in the memory array, for example, dependently upon whether or nor data written in advance in the memory cells is the same data read from these memory cells. In this case, in order to test all the memory cells in the memory cell array, data should be read from each memory cell after the data is written in advance in all the memory cells. In normal data writing, however, data can be written into only one memory cell at one time. Thus, if the total number of memory cells in the memory array increases due to an increase in the storage capacity of the memory, a long time has to be spent for data writing for testing, resulting in an increase in the time required for a functional testing of the memory, in which the above-described presence/absence of defects of the memory cells and other problems are checked.

Thus, in the memory shown in FIG. 12, a testing circuit 20, including a write circuit 30 for performing data writing for testing in a different path from that established in normal data writing, is provided on a common chip on which memory array 10, data input circuit 101, data output circuit 102, multiplexer 103, column decoder 104, sensing circuit 105, address buffer 106, row decoder 107 and word driver 108 are provided, in order to reduce the time required for data writing for testing.

Testing circuit 20 includes write circuit 30, a comparison circuit 40 and a detection circuit 50. In testing, write circuit 30 receives as an input, data $D_{TE}$ for testing which is to be written in advance. Write circuit 30 simultaneously writes the data $D_{TE}$ into all memory cells connected to a single word line at a time. When this writing is completed, comparison circuit 40 is supplied with inversion data $\overline{D_{TE}}$ of the previously written data $D_{TE}$ as expected data. Also, the operation of row decoder 107 as described above causes data to be read simultaneously from all the memory cells connected to the single word line, into which the data $D_{TE}$ is written in advance. Comparison circuit 40 makes a comparison between the read data and the inversion data $\overline{D_{TE}}$.

As the result of comparison by comparison circuit 40, if none of the read data match the inversion data $\overline{D_{TE}}$, i.e., the same data as the previously written data are read from all of the memory cells connected to the single word line, then detection circuit 50 outputs a flag signal DS of a predetermined logic level indicating that no defective memory cells exist. Conversely, if any of the read data matches the inverted data $\overline{D_{TE}}$, i.e., different data from the previously written data is read from at least one of the memory cells connected to the single word line, then detection circuit 50 outputs a flag signal DS of the opposite logic level to the predetermined logic level, indicating that a defective memory cell exists.

As described above, in this memory, a so-called line test is carried out by testing circuit 20, in which the presence/absence of defects of all the memory cells arranged in one word line direction (a row direction) in memory array 10 is checked at a time.

FIG. 13 is a circuit diagram showing the configuration of testing circuit 20 and peripheries thereof. The circuit of FIG. 13 is described in "1987 International TEST Conference", pp. 1066–1071. Referring to FIG. 13, memory array 10 is connected with testing circuit 20. Four word lines WL1–WL4 and two bit line pairs B1, $\overline{B1}$ and B2, $\overline{B2}$ are representatively shown.

Write circuit 30 includes N channel MOS transistors Q1–Q4, a write control line WC and write lines W and $\overline{W}$. Comparison circuit 40 includes comparators having a common structure and provided corresponding to respective bit line pairs. The comparators provided corresponding to bit line pairs B1, $\overline{B1}$ and B2, $\overline{B2}$ are representatively shown in FIG. 13. A comparator CP1 corresponding to bit line pair B1, $\overline{B1}$ includes N channel MOS transistors Q5 and Q6. Similarly, a comparator CP2 corresponding to bit line pair B2, $\overline{B2}$ includes N channel MOS transistors Q7 and Q8.

A description will now be made of operation of testing circuit 20 upon line testing.

Data of the H level and that of the L level, for example, are first supplied to write lines W and $\overline{W}$, respectively, so that the potential of write control line WC is raised to the H level. Accordingly, transistors Q1–Q4 are rendered conductive, so that the potential of bit lines B1 and B2 attains the H level, and the potential of bit lines $\overline{B1}$ and $\overline{B2}$ attains the L level. Now, the potential of word line WL1, for example, is raised to the H level by word driver 108 in FIG. 12 so that the word line may be activated. In response to the rise of the potential of word line WL1, data of the H level is written into memory cells M1 and M3. After this writing, the potential of word line WL1 attains the L level by word driver 108 so that the word line may be deactivated, and also the potential of write control line WC attains the L level.

Thereafter, when the potential of word line WL1 is again raised to the H level by word driver 108, potential changes depending on the data stored in memory cells M1 and M3 occur on bit lines B1 and B2. The potential changes on bit line pair B1, B2 are amplified by sensing circuit 105 in FIG. 12, as described above. As a result, each of bit line pairs B1, $\overline{B1}$ and B2, $\overline{B2}$ attains complementary potentials depending on data read from memory cells M1 and M3.

Data of the L level and that of the H level are then supplied to write lines W and $\overline{W}$, respectively, oppositely to the case of data writing.

Detection circuit 50 includes an inverter G1, an N channel MOS transistor Q9 connected between an input terminal of inverter G1 and ground and having its gate receiving the potential on the connecting point between transistors Q5 and Q6 (an output terminal of comparator CP1), an N channel MOS transistor Q10 having its gate receiving the potential on the connecting point between transistors Q7 and Q8 (an output terminal of a comparator CP2), and a precharge circuit 51 connected to a connecting line N11 connecting transistors Q9 and Q10 and inverter G1. In practice, not only transistors Q9 and Q10 but also N channel MOS transistors are provided between inverter G1 and ground, one for each comparator provided corresponding to each of all the other bit line pairs. Precharge circuit 51 precharges connecting line N11 to the H level upon the start of testing.

When data is read out of memory cells M1 and M3, into which data for testing is written as described above, the potential of bit lines B1 and B2 attains the H level, and the potential of bit lines $\overline{B1}$ and $\overline{B2}$ attains the L level when the read data is at the same H level as that of the previously written data for testing. Accordingly, transistors Q5 and Q7 are rendered conductive in comparators CP1 and CP2, so that the potential of a connecting line N9 connecting comparator CP1 and transistor Q9 and that of a connecting line N10 connecting comparator CP2 and transistor Q10 both attain the L level in response to the potential on write line W. Thus, transistors Q9 and Q10 are put in an OFF state, so that the potential of connecting line N11 precharged by precharge circuit 51 does not fall. Accordingly, if data read from any other memory cells connected to word line WL1 is at the same H level as that of the previously written data, none of the N channel MOS transistors provided one for each comparator in detection circuit 50 are rendered conductive, so that a signal of the L level representing that no defective memory cells exist is output from inverter G1. This output of inverter G1 is the above-described flag signal DS.

Assuming now that memory cell M1 is defective, for example, data read from memory cells M1 and M3 attain the L level and the H level respectively despite the fact that data of the H level is written in memory cells M1 and M3. In response to the data attaining the L level and the H level, sensing circuit 105 performs the opposite operation from that of the foregoing case, so that the potentials of bit lines B1 and $\overline{B1}$ attain the L level and the H level, respectively. Write lines W and $\overline{W}$ are supplied with data of the L level and that of the H level, respectively. Accordingly, transistor Q6 becomes conductive in response to the H level potential on bit line $\overline{B1}$, and connecting line N9 is charged to the H level. This causes transistor Q9 to be conductive, so that connecting line N11 is coupled to ground to be discharged to the L level. As a result, a flag signal DS of the H level representing that defective memory cells exist is output from inverter G1. More specifically, if there is one defective memory cell of all memory cells connected to a selected word line, then an output of a comparison circuit provided corresponding to a bit line pair corresponding to the defective memory cell causes a corresponding transistor in detection circuit 50 to be conductive, so as to lower the potential of connecting line N11 to the L level. This causes flag signal DS to attain the H level.

In this manner, the same data is written via write lines W and $\overline{W}$ in the memory cells of a single row connected to the selected single word line. Then, data is read from the memory cells of that row, and the opposite data from the previously applied data are applied to write lines W and $\overline{W}$, respectively. When all the data read from the memory cells of the single row match the data previously written in those memory cells of the single row, the flag signal DS attains a logic level indicating that no defective memory cells exist. On the other hand, if there is at least one defective memory cell of the memory cells of the single row connected to the single word line, and data read from that defective memory cell does not match previously written data, the flag signal DS attains a logic level indicating that the defective memory cell exists.

As described above, in the memory including the on-chip testing circuit shown in FIG. 13, after the data for testing is written in all the memory cells connected to the single word line at the same time, a test is carried out for the memory cells at the same time. Therefore, a substantial reduction in test time is expected.

As has been mentioned above, in the conventional semiconductor memory device enabling the reduction in the test time, since the write control line and the write lines are provided in common to all the bit lines as shown in FIG. 13, identical data is written into the memory cells of a single row connected to a single word line. In other words, the pattern of test data entered in the memory cells of the single row is all the H level data or the L level data. Thus, it is impossible to perform a test which is enabled by writing of alternate data into two adjacent memory cells in a row direction, e.g., a detection of data interference between the adjacent memory cells, and the like. Therefore, in the conventional art, although the test time can be decreased by line testing, the kinds of tests practicable in shorter test time are limited. It is thus becomes difficult to detect defective memory cells from many aspects, resulting in a degradation in sensitivity of detection of the defective memory cells.

SUMMARY OF THE INVENTION

One object of the present invention is to provide a semiconductor memory device in which a functional testing can be carried out at high speed for a memory cell array.

Another object of the present invention is to provide a semiconductor memory device having an enhanced sensitivity of detection of a defective memory cell.

A further object of the present invention is to provide a semiconductor memory device in which a functional testing can be carried out at high speed without degradations in sensitivity of detection of a defective memory cell.

A still further object of the present invention is to provide a semiconductor memory device in which a defective memory cell can be detected according to various aspects.

A still further object of the present invention is to provide a semiconductor memory device in which a detection can be made at one time as to the presence/absence of defects of a plurality of memory cells after data for testing is written in an arbitrary pattern into a memory array.

A still further object of the present invention is to provide a semiconductor memory device in which various functional testings can be carried out at high speed, which are enabled by writing of different data for testing into adjacent memory cells in the direction of rows.

A still further object of the present invention is to provide a semiconductor memory device in which data for testing can be written at high speed in an arbitrary pattern into a memory array.

In order to achieve the foregoing objects, a semiconductor memory device in accordance with the present invention includes a memory array, a preliminary memory array and a transfer circuit. The memory array includes a plurality of memory cells each connected to word lines and bit lines and arranged in matrix in the direction of rows and the direction of columns. The preliminary memory array includes a plurality of preliminary memory cells each connected to preliminary word lines and the bit lines and arranged in matrix in the direction of rows and the direction of columns. The number of the preliminary word lines is much less than that of the word lines. The transfer circuit transfers simultaneously storage data of either memory cells of a single row connected to a single word line or preliminary memory cells of a single row connected to a single preliminary word line, to the other memory cells or preliminary memory cells via the bit lines.

Preferably, the transfer circuit includes a first reading circuit for reading simultaneously the storage data of preliminary memory cells of a single row connected to a single preliminary word line onto the bit lines, a first selecting/activating circuit responsive to the reading of the first reading circuit for selecting a single word line to activate the same, a second reading circuit for reading simultaneously the storage data of memory cells of a single row connected to one word line onto the bit lines, and a second selecting/activating circuit responsive to the reading of the second reading circuit for selecting a single preliminary word line to activate the same.

Preferably, the second selecting/activating circuit includes a preliminary word line selecting signal outputting circuit responsive to a first external address signal for outputting a preliminary word line selecting signal for selecting two preliminary word lines, a preliminary word line activating signal applying circuit responsive to the preliminary word line selecting signal from the preliminary word line selecting signal outputting circuit and a second external address signal for applying to one of the two preliminary word lines corresponding to the second address signal, an activating signal for activating the corresponding preliminary word line, and a first forcing circuit responsive to a first control signal for forcing an output of the preliminary word line selecting signal outputting circuit to a non-selecting signal selecting neither of the preliminary word lines. According to another preferred embodiment, the preliminary word line activating signal applying circuit responds to the preliminary word line selecting signal from the preliminary word line selecting signal outputting circuit for applying to arbitrary one of the two preliminary word lines independently of the first external address signal, an activating signal for activating the one preliminary word line. If the preliminary word line selecting signal outputting circuit further includes a circuit responsive to a specified first external address signal for outputting a preliminary word line selecting signal independently of the forcing by the first forcing circuit, then a specified preliminary memory cell can be fixedly employed in place of a defective memory cell. The first selecting/activating circuit includes a word line selecting signal outputting circuit responsive to a first external address signal for outputting a word line selecting signal for selecting two word lines, a word line activating signal applying circuit responsive to the word line selecting signal from the word line selecting signal outputting circuit and a second external address signal for applying to one of the two word lines, an activating signal for activating the corresponding word line, and a second forcing circuit responsive to the preliminary word line selecting signal from the preliminary word line selecting signal outputting circuit for forcing an output of the word line activating signal applying circuit to a non-activating signal incapable of activating the word line.

Preferably, the semiconductor memory device in accordance with the present invention further includes a circuit for individually writing data into each of the preliminary memory cells of each row in the same manner as the conventional.

The principle of data reading from memory cells and preliminary memory cells is the same as the conventional. More specifically, the following feature is utilized: that is, the potential on a bit line connected to an arbitrary memory cell changes dependently on storage data of the arbitrary memory cell in response to activation of a word line connected to the arbitrary memory cell, and the potential on a bit line connected to an arbitrary preliminary memory cell changes dependently on storage data of the arbitrary preliminary memory cell in response to activation of a preliminary word line connected to the arbitrary preliminary memory cell. Accordingly, the first reading circuit includes the preliminary word line selecting circuit, the preliminary word line activating circuit, and the amplifying circuit for amplifying potential changes on each of the bit lines. The second reading circuit includes the word line selecting circuit, the word line activating circuit and the amplifying circuit.

As described above, the semiconductor memory device in accordance with the present invention includes a circuit which responds to the first reading circuit reading simultaneously onto the bit lines, a single row of data written individually into a plurality of preliminary memory cells, to select one word line connected to a plurality of memory cells provided separately from the preliminary memory cells and then to activate the selected word line. Thus, the read storage data of the preliminary memory cells can be written simultaneously into the plurality of memory cells of one row via the bit lines in the period of a single reading operation by the first reading circuit. Therefore, data can be written at high speed into the plurality of memory cells provided separately from the preliminary memory cells. Further, the semiconductor memory device in accordance with the present invention also includes a circuit which responds to the second reading circuit reading simultaneously storage data from memory cells of a single row onto the bit lines, to select a preliminary word line and then to activate the same. Thus, the read storage data of the memory cells of a single row can be simultaneously written into the preliminary memory cells of a single row via the bit lines in the period of a single reading operation by the second reading circuit.

According to another aspect, the present invention is directed to a method in which external data for a functional testing is written in an arbitrary pattern at high speed into a plurality of memory cells included in a semiconductor memory device including the plurality of memory cells each connected to word lines and bit lines and arranged in matrix in the direction of rows and the direction of columns, and a plurality of preliminary memory cells each connected to preliminary word lines and the bit lines and arranged in matrix in the direction of rows and the direction of columns. The method includes the steps of: individually writing data corresponding to the arbitrary pattern into each of the preliminary memory cells of each row; selecting a single preliminary word line to activate the same after the writing is completed, thereby reading data onto the bit lines simultaneously from the preliminary memory cells of a single row connected to the single preliminary word line; and selecting one word line to activate the same in response to the data reading, thereby transferring the read data via the bit lines simultaneously into the memory cells of a single row connected to the selected one word line.

A testing circuit is already proposed which employs the following method. That is, after data for testing is written into a memory array, data is simultaneously read from memory cells of a single row in this memory array. The read data is then individually and simultaneously compared with certain data, so that a detection is made as to whether or not there is a defect in any of the memory cells of the single row. Thus, more preferably, such a testing circuit and the above-described configuration for writing the test data in the arbitrary pattern into the memory array at high speed are employed together. In this case, since the time required for the functional testing of the memory array is reduced from both aspects of the test data writing and the defective memory cell detection after this writing, the speed of the functional testing is enhanced more effectively.

Therefore, in accordance with the present invention, since the data written into the preliminary memory array can be transferred at high speed to the normal memory array, the functional testing of the normal memory array can be carried out at higher speed and with higher sensitivity by employing random data patterns while suppressing an increase in the area of circuitry for the functional testing.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3, 4 and 5 are time charts for explaining an operation of the circuitry shown in FIG. 2;

FIG. 6(a)–(f) are diagrams showing examples of data patterns writable at high speed into a normal memory array by the preliminary and normal row decoders and the preliminary and normal word drivers shown in FIG. 2;

FIG. 9(a)–(b) are diagrams showing examples of data patterns writable at high speed into a normal memory array by the preliminary row decoder and the preliminary word driver shown in FIG. 7;

DESCRIPTION OF THE PREFERRED EMBODIMENTS

Figure 1:
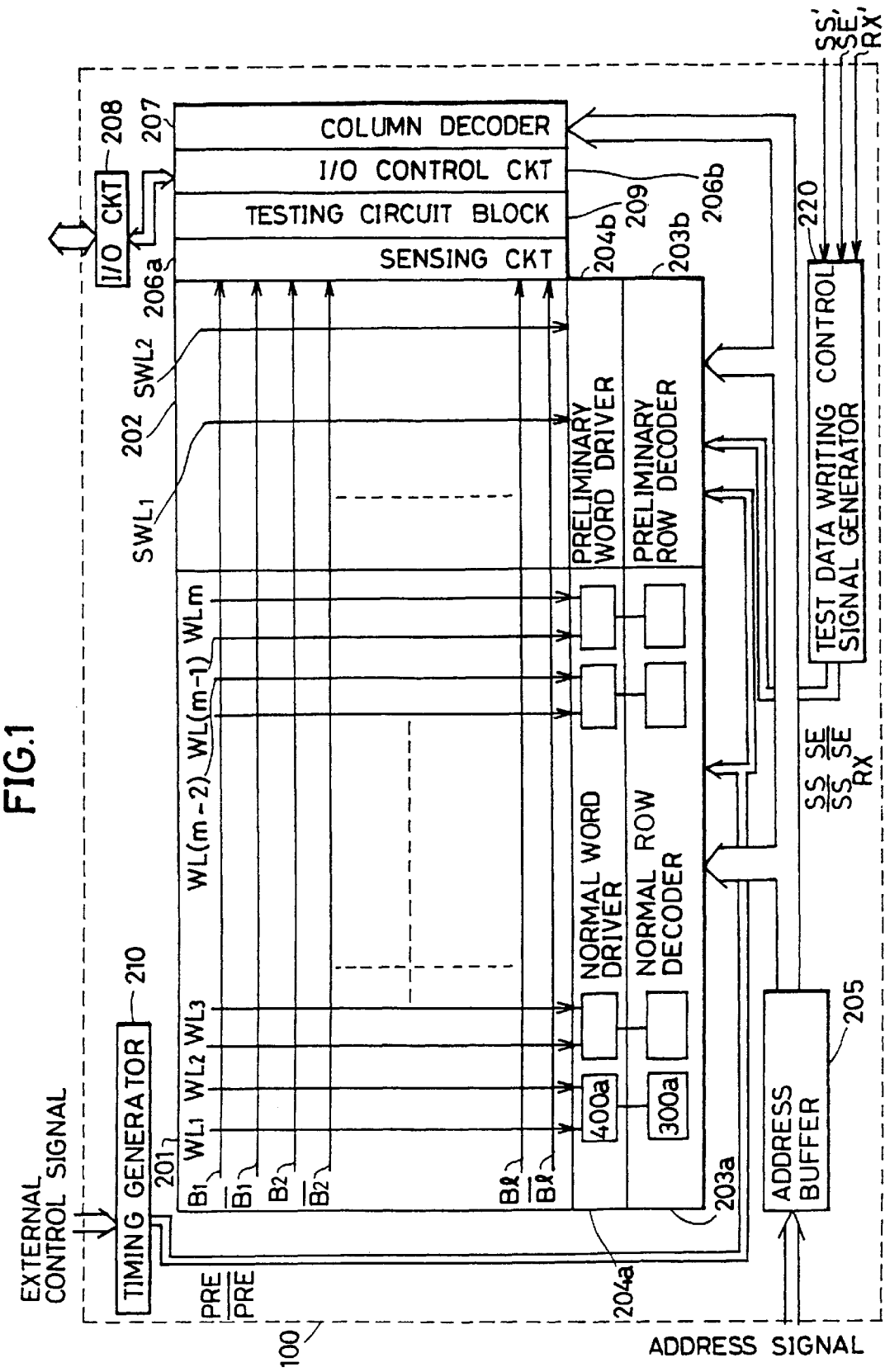
FIG. 1 is a schematic block diagram showing the entire structure of a semiconductor memory device according to one embodiment of the present invention.

FIG. 1 is a schematic block diagram showing the entire structure of a semiconductor memory device according to one embodiment of the present invention.

With reference to FIG. 1, this semiconductor memory device 100 has a structure employing a so-called redundancy circuit system which includes in addition to a normal memory array 201, a preliminary memory array 202 comprising a preliminary memory cell array to be substituted for a defective memory cell existing in the normal memory array 201.

Figure 13:
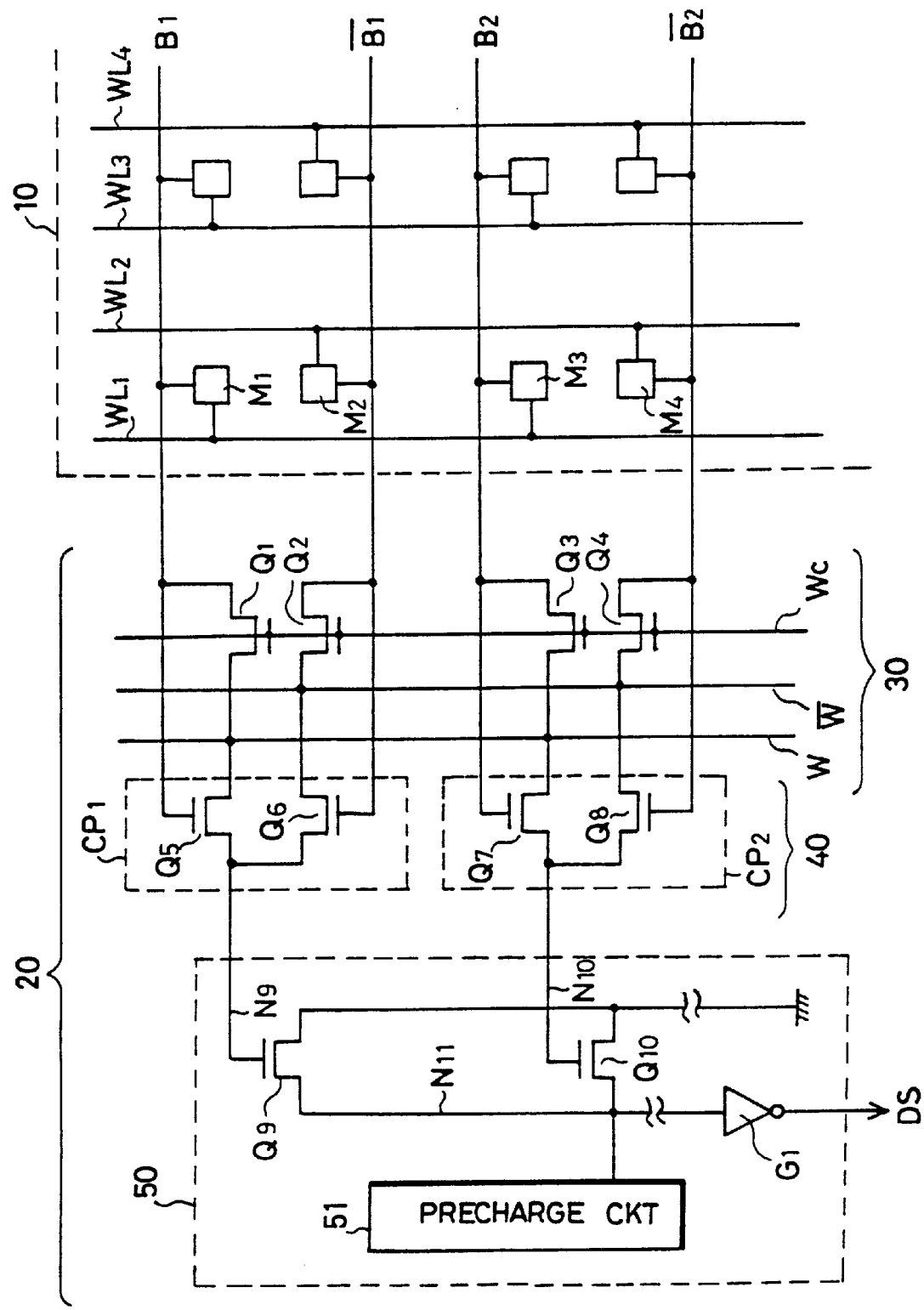
FIG. 13 is a circuit diagram showing the configuration of a testing circuit and peripheries thereof in FIG. 12.

Normal memory array 201 has the same structure as that of memory array 10 shown in FIG. 13 and includes a plurality of bit line pairs B1 and $\overline{B1}$, B2 and $\overline{B2}$ ... Bl and $\overline{Bl}$ (l is a natural number), a plurality of word lines WL1–WLm (m is a natural number) arranged to cross those bit line pairs, and memory cells (not shown) provided one for each of cross-over points between all the word lines and all the bit lines constituting those bit line pairs.

Preliminary memory array 202 includes bit lines B1, $\overline{B1}$, B2, $\overline{B2}$ ... Bl, $\overline{Bl}$ common to the bit lines of normal memory array 201, word lines (spare word lines) SWL1 and SWL2 different from word lines (normal word lines) WL1–WLm of normal memory array 201, and preliminary memory cells (not shown) provided one for each of cross-over points between the common bit lines B1, $\overline{B1}$–Bl, $\overline{Bl}$ and the spare word lines SWL1 and SWL2.

This semiconductor memory device further includes an address buffer 205 for buffering an externally applied address signal, a normal row decoder 203a responsive to the address signal buffered by address buffer 205 for selecting a single word line corresponding to the address signal from word lines WL1–WLm in normal memory array 201, and a preliminary row decoder 203b responsive to the address signal for selecting a single spare word line corresponding to the address signal from spare word lines SWL1 and SWL2 in preliminary memory array 202.

The semiconductor memory device further includes a normal word driver 204a for activating the word line selected by normal row decoder 203a so as to enable data writing/reading to and from memory cells provided corresponding to the selected word line, a preliminary word driver 204b for activating the spare word line selected by preliminary row decoder 203b so as to enable data writing/reading to and from memory cells provided corresponding to the selected spare word line, a sensing circuit 206a, an I/O control circuit 206b, a column decoder 207, and an input/output circuit 208.

Figure 12:
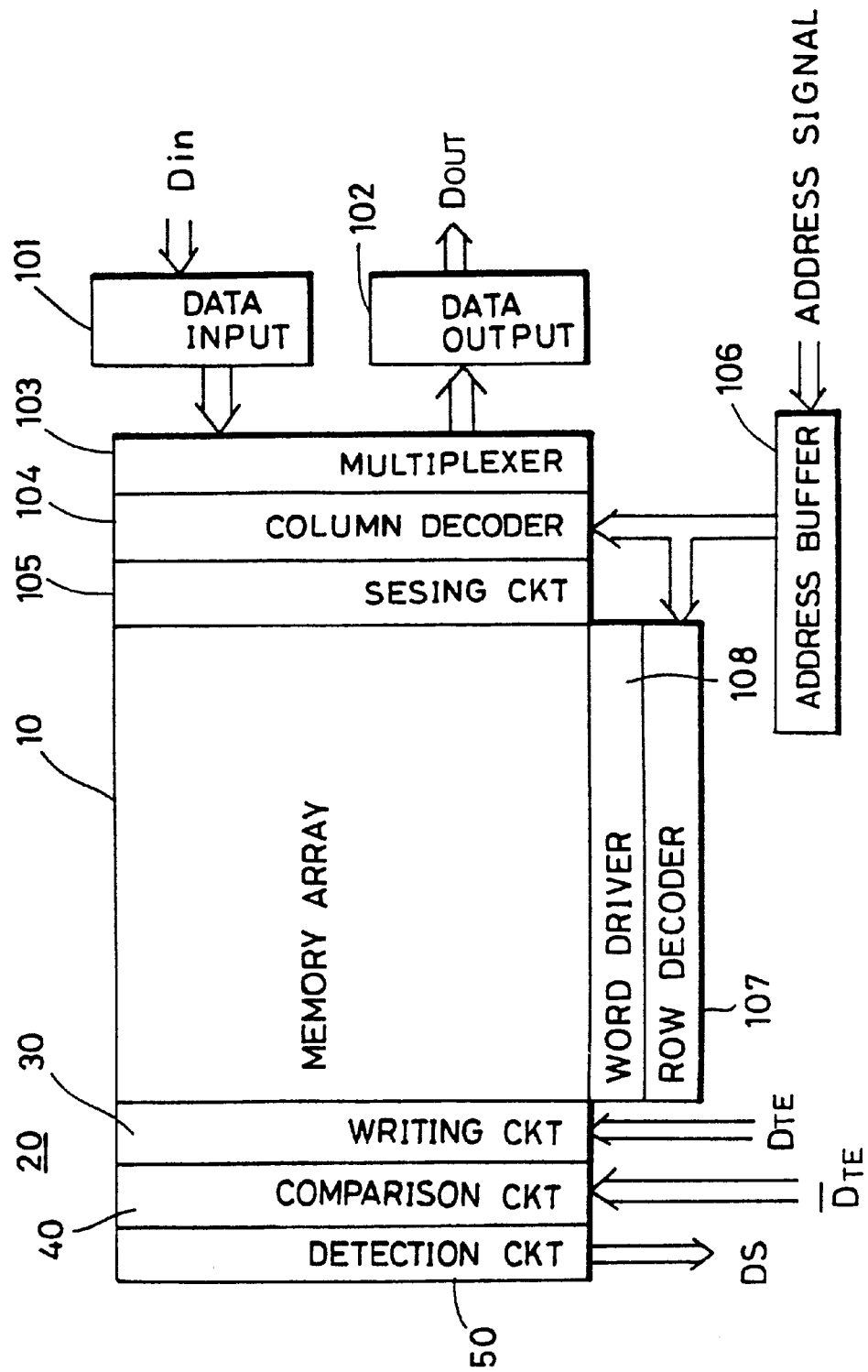
FIG. 12 is a schematic block diagram showing the entire structure of a conventional semiconductor memory device enabling a line testing.

Like the case of the semiconductor device shown in FIG. 12, column decoder 207 responds to an address signal applied via address buffer 205 to select a pair of bit lines corresponding to the applied address signal from bit line pairs B1, $\overline{B1}$–Bl, $\overline{Bl}$. Sensing circuit 206a amplifies data appearing on the bit line pair selected by column decoder 207 in data reading. I/O control circuit 206b supplies as an output the data amplified by sensing circuit 206a to input/output circuit 208. In data reading, sensing circuit 206a and I/O control circuit 206b apply complementary potentials corresponding to the data applied from input/output circuit 208 to two bit lines constituting the bit line pair selected by column decoder 207.

Input/output circuit 208 accepts externally applied data and also outputs data applied from I/O control circuit 206b.

As described above, the entire structure of the semiconductor memory device is the same as that of the conventional semiconductor memory device including a preliminary memory array. In this semiconductor memory device, however, normal row decoder 203a, normal word driver 204a, preliminary row decoder 203b and preliminary word driver 204b are all configured such that storage data of memory cells of a single row connected to a single word line can be simultaneously transferred between normal memory array 201 and preliminary memory array 202.

Specifically, preliminary row decoder 203b and normal row decoder 203a are controlled in response to a spare enable signal SE and an inversion signal $\overline{SE}$ thereof, so that they can be enabled alternately. When preliminary row decoder 203b is first enabled, spare word line SWL1 or SWL2 selected by preliminary row decoder 203b is first activated by preliminary word driver 204b, so that storage data of all the memory cells connected to the selected spare word line appear on corresponding bit line pairs. When normal row decoder 203b is then enabled, the normal word line selected by normal row decoder 203b is activated by normal word driver 204a. Accordingly, the storage data of all the memory cells connected to the selected spare word line are written into all the memory cells connected to the selected normal word line through their corresponding bit line pairs. Conversely, if normal row decoder 203b is first enabled, the normal word line selected by normal row decoder 203a is first activated by normal word driver 204a, and subsequently the spare word line selected by preliminary row decoder 203b is activated by preliminary word driver 204b. Thus, the storage data of all the memory cells connected to the selected normal word line appear on their corresponding bit lines during a period in which normal row decoder 203b is activated, and then written into all the memory cells connected to the selected spare word line.

Therefore, the storage data of the memory cells of a single row can be simultaneously transferred between all the memory cells provided corresponding to one arbitrary spare word line and all the memory cells provided corresponding to at least one normal word line in one write cycle in which data writing into one memory cell starts and then ends.

Figure 2A:
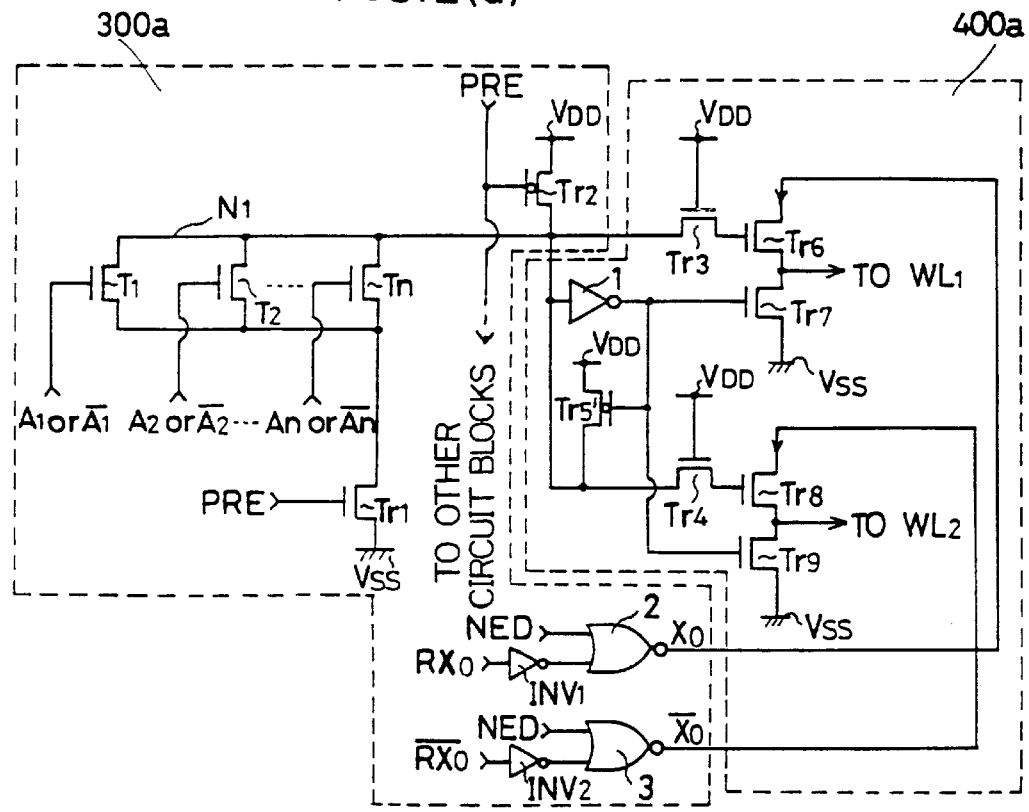
FIG. 2(a) and FIG. 2(b) are circuit diagrams showing the configuration of preliminary and normal row decoders and preliminary and normal word drivers in FIG. 1.
Figure 2B:
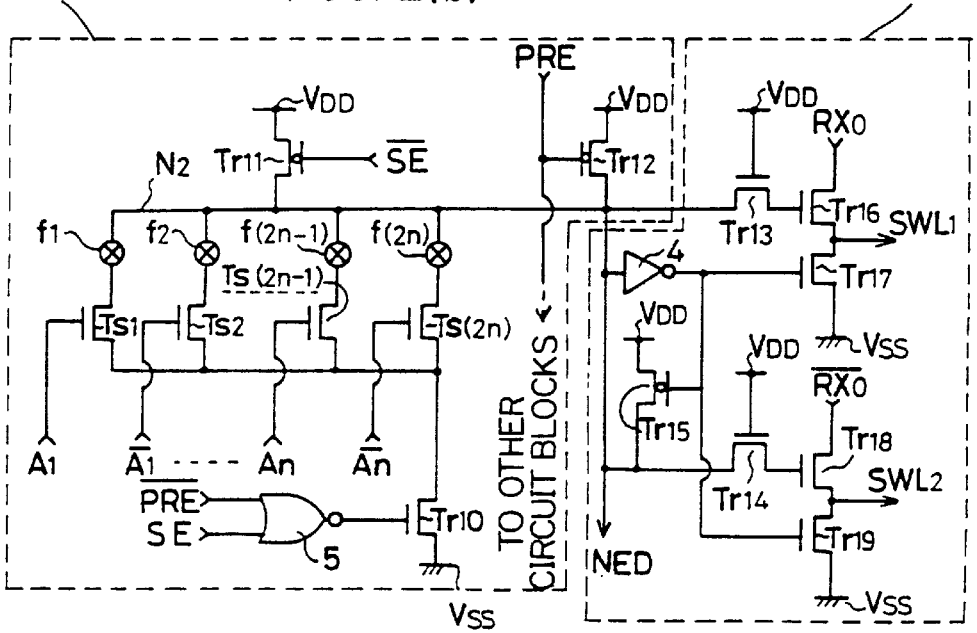

FIG. 2(a) is a circuit diagram showing the configuration of normal row decoder 203a and normal word driver 204a; and FIG. 2(b) is a circuit diagram showing the configuration of preliminary row decoder 203b and preliminary word driver 204b.

With reference to FIG. 2(a), normal row decoder 203a of FIG. 1 comprises a circuit block 300a including N channel MOS transistors $T_1$–$T_n$ having their gates respectively receiving data $A_1$–$A_n$ of n bits (n is an arbitrary natural number) included in an address signal of n+1 bits applied through address buffer 205 of FIG. 1, in either a non-inversion state or an inversion state, inverters INV1 and INV2 each receiving data $RX_0$ of another bit included in the above-described address signal in both the inversion state and the non-inversion state, an N channel MOS transistor Tr1 and P channel MOS transistor Tr2 having their gates receiving an external row decoder precharge signal PRE, a 2-input NOR gate 2 receiving as inputs a normal decoder deactivating signal NED which will be described later and an output of inverter INV1, and a 2-input NOR gate 3 receiving as inputs the normal decoder deactivating signal NED and an output of inverter INV2. The address signal $RX_0$ represents whether word line WL1 in normal memory cell array 201 of FIG. 1 is selected or not.

Transistors $T_1$–$T_n$ connected in parallel are provided between a power supply $V_{DD}$ and transistor Tr1. Transistor Tr2 is connected in series between power supply $V_{DD}$ and one common connecting line N1 of transistors $T_1$–$T_n$. Transistor Tr1 is connected in series between the other common connecting line of transistors $T_1$–$T_n$ and ground $V_{SS}$.

In address deactivating when no data writing/reading is carried out, that is, in a standby state, row decoder precharge signal PRE is at the L level to bring transistors Tr2 and Tr1 into an ON state and an OFF state, respectively. Accordingly, connecting line N1 is precharged to the H level in response to a high potential of power supply $V_{DD}$ independently of the potentials of input signals to the respective gates of transistors $T_1$–$T_n$. When data writing/reading then starts, the precharge signal PRE is changed to the H level. Accordingly, transistor Tr1 is turned on, and transistor Tr2 is turned off, opposite from the case of the standby state. In data writing/reading, address signals $A_0$–$A_n$ and $RX_0$ are applied in both the inversion state and the non-inversion state from address buffer 205 of FIG. 1. Thus, in data writing/reading, in circuit block 300a, if at least one of input signals to the respective gates of transistors $T_1$–$T_n$ is at the H level, a transistor of those transistors $T_1$–$T_n$, which has its gate receiving this applied high level signal, and transistor Tr1 lowers the potential on connecting line N1 down to the L level in response to a low potential of ground $V_{SS}$.

On the other hand, normal decoder deactivating signal NED serves to disable or enable a word line selecting operation of normal row decoder 203a. If normal decoder deactivating signal NED is at the H level, the word line selecting operation of normal row decoder 203a is disabled. Conversely, if normal decoder deactivating signal NED is at the L level, the word line selecting operation of normal row decoder 203a is enabled.

If normal decoder deactivating signal NED is at the H level, respective outputs of NOR gates 2 and 3 attain the L level independently of the logic level of address signal $RX_0$ and an inversion signal $\overline{RX_0}$ thereof. If normal decoder deactivating signal NED is at the L level, however, NOR gates 2 and 3 output the logic level of address signal $RX_0$ and that of inversion signal $\overline{RX_0}$, respectively. That is, NOR gates 2 and 3 output address signal $RX_0$ and inversion signal $\overline{RX_0}$, respectively.

A circuit block 400a constitutes normal word driver 204a of FIG. 1 and includes N channel MOS transistors Tr6 and TR7 provided between an output terminal of NOR gate 2 and ground $V_{SS}$, N channel MOS transistors Tr8 and Tr9 provided between an output terminal of NOR gate 3 and ground $V_{SS}$, and an inverter 1 for inverting the potential on connecting line N1. Transistors Tr7 and Tr9 receive an output of inverter 1 through their gates. Circuit block 400a further includes N channel MOS transistors Tr3 and Tr4 which become conductive in response to the potential of power supply $V_{DD}$ applied through their gates, to supply the potential on connecting line N1 to respective gates of transistors Tr6 and Tr8, and a P channel MOS transistor Tr5 provided between power supply $V_{DD}$ and an input terminal of inverter 1 and receiving an output of inverter 1 through its gate. The connection point between transistors Tr6 and Tr7 is connected to word line WL1 in normal memory array 201 of FIG. 1. The connection point between transistors Tr8 and Tr9 is connected to word line WL2 in normal memory array 201.

In data writing/reading, if the potential on connecting line N1 in circuit block 300a attains the L level in response to an applied address signal, transistors Tr6 and Tr8 become nonconductive, so that an output of inverter 1 attains the H level, and transistors Tr7 and Tr9 become conductive in circuit block 400a. Accordingly, the potentials on word lines WL1 and WL2 both attain the L level. More specifically, circuit block 300a selects neither word line WL1 nor WL2, and hence circuit block 400a activates neither word line WL1 nor WL2.

In data writing/reading, when the potential on connecting line N1 is held at the potential in precharge, i.e., the H level even if an address signal is input, inverter 1 renders neither transistor Tr7 nor Tr9 conductive. In this case, since a potential on the input terminal of inverter 1, i.e., the potential on connecting line N1 is at the H level, transistors Tr6 and Tr8 become conductive, so that the respective outputs of NOR gates 2 and 3 are transmitted to respective word lines WL1 and WL2. Accordingly, if normal decoder deactivating signal NED is at the L level at this time, complementary signals $RX_0$ and $\overline{RX_0}$ are transmitted to word lines WL1 and WL2, respectively. That is to say, only one of word lines WL1 and WL2 selectively attains the H level. If normal decoder deactivating signal NED is at the H level, since both outputs of NOR gates 2 and 3 are at the L level, word lines WL1 and WL2 attain the L level. This means that neither word line WL1 nor WL2 is activated.

Specifically, data to be applied to the respective gates of transistors $T_1$–$T_n$ are selected such that only when an address signal is input to select word line WL1 or WL2, all transistors $T_1$–$T_n$ are turned off, so that the potential on connecting line N1 maintains the H level. Therefore, in data writing/reading, if normal decoder deactivating signal NED is at the L level, circuit block 400a responds to address signals $A_1$–$A_n$ and $RX_0$ selecting memory cells provided corresponding to word lines WL1 and WL2, to activate the word line corresponding to the memory cells to be selected.

Actually, normal row decoder 203a of FIG. 1 includes circuit blocks having the same configuration as circuit block 300a, one for every two normal word lines, and normal word driver 204a includes circuit blocks having the same configuration as circuit block 400a, one for every two normal word lines. More specifically, normal row decoder 203a includes in addition to circuit block 300a shown in FIG. 2(a), a circuit block in which input signals to the respective gates of transistors $T_1$–$T_n$ are set to hold the potential on connecting line N1 at the H level only when an address signal for selecting memory cells provided corresponding to word lines WL3 and WL4 in memory array 201 is received; a circuit block in which the input signals to the respective gates of transistors $T_1$–$T_n$ are set to hold the potential on connecting line N1 at the H level only when an address signal for selecting memory cells provided corresponding to word lines WL5 and WL6 is received; . . . ; and a circuit block in which the input signals to the respective gates of transistors $T_1$–$T_n$ are set to hold the potential on connecting line N1 at the H level only when an address signal for selecting memory cells provided corresponding to word lines WL (m−1) and WLm is received. Normal word driver 204a includes in addition to circuit block 400a shown in FIG. 2(a) and corresponding to the respective foregoing circuit blocks having the same configuration as circuit block 300a shown in FIG. 2(a), a circuit block for causing a potential on one of word lines WL3 and WL4 to attain the H level in accordance with the H level potential held on connecting line N1 in response to an address signal for selecting memory cells provided corresponding to word lines WL3 and WL4; a circuit block for causing a potential on one of word lines WL5 and WL6 to attain the H level in accordance with the H level potential held on connecting line N1 in response to an address signal for selecting memory cells provided corresponding to word lines WL5 and WL6; . . . ; and a circuit block for causing a potential on one of word lines WL (m−1) and WLm to attain the H level in accordance with the H level potential held on connecting line N1 in response to an address signal for selecting memory cells provided corresponding to word lines WL (m−1) and WLm.

In the case of data writing/reading when normal decoder deactivating signal NED is at the L level, only a single word line is selected/activated to attain the H level, and the other word lines all attain the L level, in response to an external address signal, in normal memory array 201 of FIG. 1.

A description will now be given of the structure of preliminary row decoder 203b and preliminary word driver 204b of FIG. 1.

With reference to FIG. 2(b), preliminary row decoder 203b includes: a parallel circuit including N channel MOS transistors Ts1, Ts3, . . . , Ts (2n−1) and N channel MOS transistors Ts2, Ts4, . . . , Ts (2n) connected in parallel and having their gates receiving address signals $A_1$–$A_n$ and inversion signals $\overline{A_1}$–$\overline{A_n}$ thereof, respectively, applied from address buffer 205 of FIG. 1; a P channel MOS transistor Tr12 receiving the above-described precharge signal PRE through its gate; a 2-input NOR gate 5 receiving an inversion signal $\overline{PRE}$ of the precharge signal PRE and a spare enable signal SE which will be described later; an N channel MOS transistor Tr10 receiving an output of NOR gate 5 through its gate; and a P channel MOS transistor Tr11 receiving an inversion signal $\overline{SE}$ of the spare enable signal SE through its gate.

The foregoing parallel circuit and transistors Tr10 and Tr12 are connected in series between a power supply $V_{DD}$ and ground $V_{SS}$. Transistor Tr11 is connected in parallel to transistor Tr12. Fuses f1–f (2n) are interposed between the respective transistors Ts1–Ts (2n) and transistor Tr11. In case where there is a defective memory cell in normal memory array 201 of FIG. 1, fuses f1–f (2n) are provided so as to change access to all the memory cells corresponding to the same row address as that of this defective memory cell into access to preliminary memory cells connected with spare word line SWL1 or SWL2 in preliminary memory array 202.

If a defective memory cell is detected in memory array 201 by functional testing, fuses f1–f (2n) are selectively cut so that a connecting line N2 may not electrically be connected to transistor Tr10 through any of transistors Ts1–Ts (2n) in preliminary row decoder 203b, when an address signal for selecting the defective memory cell is input.

An operation of this preliminary row decoder 203b will now be described.

In the case of address deactivating where no data writing/reading is carried out, since a precharge signal PRE is at the L level, the output of NOR gate 5 attains the L level, so that transistor Tr10 is turned off. Accordingly, connecting line N2 commonly connecting via the fuses transistors Ts1–Ts (2n) receiving an address signal is precharged to the H level by the conduction of transistor Tr12, like the case in circuit block 300a constituting the normal row decoder.

Spare enable signal SE is at the L level during a normal operation when no data transfer is performed between the preliminary memory array and the normal memory array. Thus, in normal operation, transistor Tr11 is in the OFF state, and NOR gate 5 inverts the inversion signal $\overline{PRE}$ of precharge signal PRE, to output the inverted inversion signal $\overline{PRE}$, i.e., precharge signal PRE always in the non-inversion state.

In data writing/reading, since precharge signal PRE changes to the H level, transistor Tr12 is turned off in data writing, and conversely transistor Tr10 is turned on. Accordingly, in data writing/reading, as far as an address signal for selecting memory cells connected to the word line corresponding to the defective memory cell is not applied, at least one of transistors Ts1–Ts (2n) becomes necessarily conductive in preliminary row decoder 203b, so that the potential on connecting line N2 is lowered to the L level in response to a low potential of ground $V_{SS}$. If the address signal for selecting the word line corresponding to the defective memory cell is applied, however, the potential on connecting line N2 is held at the H level since all the fuses provided corresponding to those of transistors Ts1–Ts (2n), which are in the conduction state.

Preliminary word driver 204b includes a series connection between N channel MOS transistors Tr16 and Tr17, a series connection between N channel MOS transistors Tr18 and Tr19, and N channel MOS transistors Tr13 and Tr14 which become conductive in response to the potential of power supply $V_{DD}$ applied to their gates, to apply the potential on connecting line N2 to respective gates of transistors Tr17 and Tr18. This preliminary word driver 204b further includes an inverter 4 for inverting the potential on connecting line N2 to supply the inverted potential to the respective gates of transistors Tr17 and Tr19, and a P channel MOS transistors Tr15 provided between an input terminal of inverter 4 and power supply $V_{DD}$. Transistor Tr15 has its gate supplied with an output of inverter 4, and transistors Tr16 and Tr18 have their drains supplied with address signal $RX_0$ and inversion signal $\overline{RX_0}$ thereof, respectively.

A potential on the input terminal of inverter 4, i.e., the potential on connecting line N2 is supplied as a normal decoder deactivating signal NED to each of the circuit blocks constituting normal row decoder 203a of FIG. 1 including circuit block 300a represented in FIG. 2. A potential on the connection point between transistors Tr16 and Tr17 is applied to spare word line SWL1 of FIG. 1, and a potential on the connection point between transistors Tr18 and Tr19 is applied to spare word line SWL2 of FIG. 1.

As has been described above, in normal operation, if an address signal serves to select the word line corresponding to the defective memory cell, the potential on connecting line N2 is at the H level. Conversely, if an address signal does not serve to select the word line corresponding to the defective memory cell, the potential on connecting line N2 is at the L level. Therefore, if the former address signal is applied in normal operation, transistors Tr15, Tr16 and Tr18 are all in the ON state, and transistors Tr17 and Tr19 are both in the OFF state in preliminary word driver 204b. Thus, address signal $RX_0$ is transmitted to the connection point between transistors Tr16 and Tr17, and the inversion signal $\overline{RX_0}$ of address signal $RX_0$ is transmitted to the connection point between transistors Tr18 and Tr19. As a result, a potential on one of spare word lines SWL1 and SWL2 attains the H level. More specifically, if the word line corresponding to the defective memory cell is designated in response to the address signal, then data writing/reading is enabled with respect to the memory cells provided corresponding to one of spare word lines SWL1 and SWL2. In this case, since normal decoder deactivating signal NED is at the H level, the outputs of NOR gates 2 and 3 both attain the L level in each of the circuit block constituting the normal row decoder, represented by circuit blocks 300a of FIG. 2. Accordingly, all the word lines in normal memory array 201 attain the L level by the circuit blocks constituting normal word driver 204a of FIG. 1, represented by circuit block 400a. Therefore, in this case, a memory cell in preliminary memory array 202 of FIG. 1 is selected in place of the defective memory cell in normal memory array 201.

Conversely, in the case of the latter address signal, since the potential on connecting line N2 attains the L level, transistors Tr15, Tr16 and Tr18 are turned off, and transistors Tr17 and Tr19 are turned on in preliminary word driver 204b, unlike the former case. Therefore, both spare word lines SWL1 and SWL2 attain the L level in this case. That is, any memory cells provided corresponding to any spare word lines in preliminary memory array 202 of FIG. 1 are not selected. In this case, since normal decoder deactivating signal NED is at the L level, address signal $RX_0$ and inversion signal $\overline{RX_0}$ thereof are output respectively from NOR gates 2 and 3 in each of the circuit blocks constituting normal row decoder 203a of FIG. 1, represented by circuit block 300a. Accordingly, any single word line in normal memory cell 201 is selected by any of the circuit blocks constituting normal word driver 204a of FIG. 1, represented by circuit block 400a. That is, if the word line corresponding to undefective memory cells is designated in response to an address signal, a memory cell in normal memory array 201 of FIG. 1 is selected.

Address signals $A_1$–$A_n$ and $RX_0$ all attain the L level in the case of address deactivating where no data reading/writing is carried out with respect to any memory cells. Accordingly, in address deactivating, transistors $T_1$–$T_n$ are all in the nonconduction state in normal row decoder 300a, and transistors Ts1–Ts (2n) are all in the nonconduction state in preliminary row decoder 203b.

Figure 3:
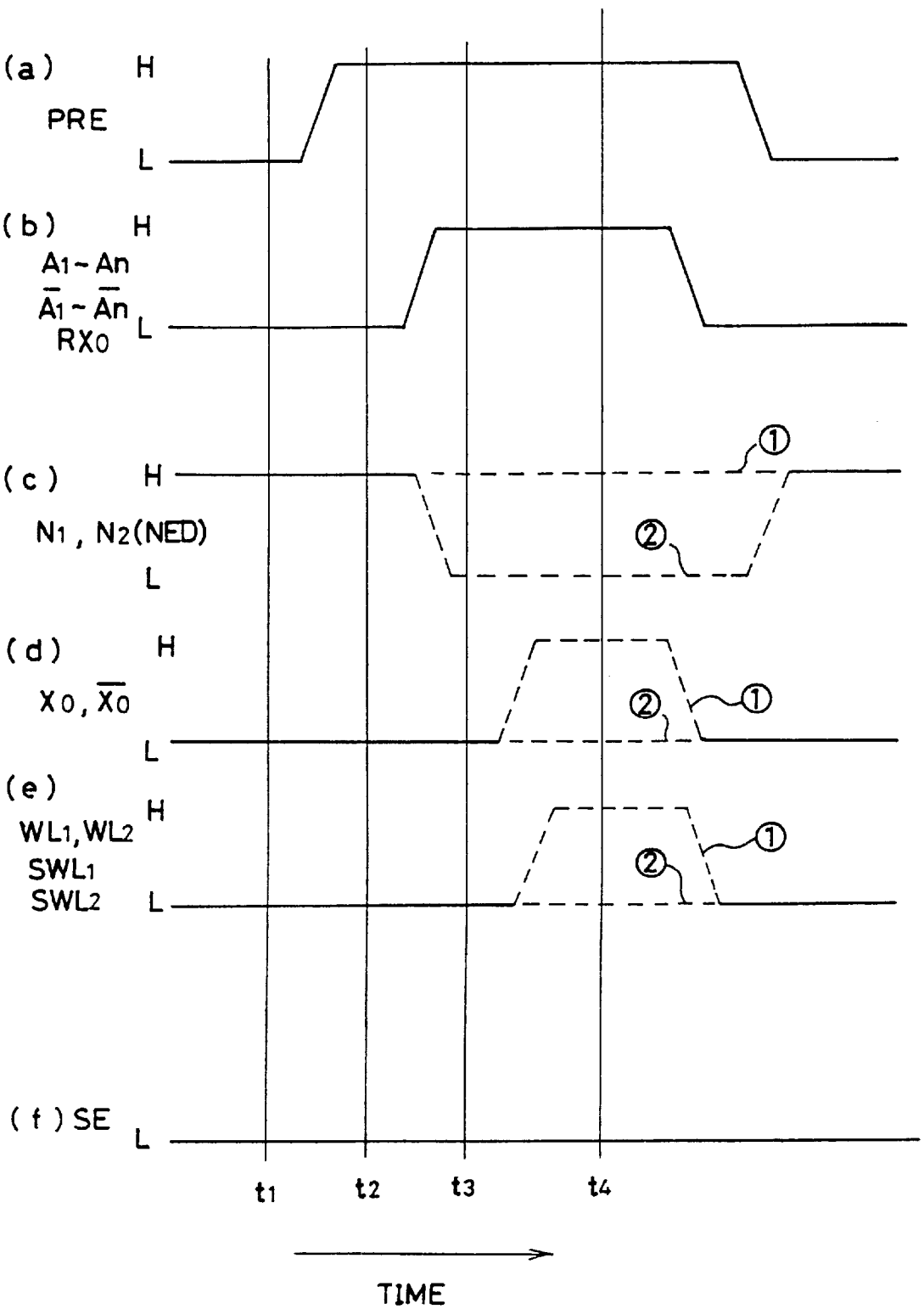

FIG. 3 is a time chart showing the operation of the serial circuit blocks when an address signal designating word line WL1, for example, is applied to the semiconductor device of FIG. 1. A further detailed description will now be made of the operation of the circuit blocks shown in FIG. 2 with reference to FIG. 3.

In the normal operation when a spare enable signal SE (FIG. 3f)) is at the L level, a precharge signal PRE attains the high level for a definite period as shown in FIG. 3(a), in data writing/reading. An address signal instructing word line WL1 is then applied as an input. More specifically, as shown in FIG. 3(b), at least one of address signals $A_1$–$A_n$, $RX_0$ and their inversion signals $\overline{A_1}$–$\overline{A_n}$ and $\overline{RX_0}$ attains the H level for a predetermined period during the period when precharge signal PRE is at the H level in order to designate word line WL1, from the address-deactivated state where all of those address signals and inversion signals are at the L level.

At time $t_1$ when precharge signal PRE is at the L level, connecting line N1 is precharged to the H level in each of the circuit blocks constituting normal row decoder 203a, represented by circuit block 300a of FIG. 2. Then, at time $t_2$ when precharge signal PRE rises to the H level, transistor Tr2 for precharging connecting line N1 is turned off, and transistors $T_1$–$T_n$, which receive address signals $A_1$–$A_n$ or their inversion signals $\overline{A_1}$–$\overline{A_n}$, are electrically connected to ground $V_{SS}$, by transistor Tr1 in each of the circuit blocks constituting normal row decoder 203a.

Similarly, connecting line N2 is precharged to the H level at time $t_1$ in preliminary row decoder 203b shown in FIG. 2. Then, at time $t_2$, transistor Tr12 for precharging connecting line N2 is turned off, and transistors Ts1, Ts3, . . . , Ts (2n–1) and transistors Ts2, Ts4, . . . , Ts (2n), which receive address signals $A_1$–$A_n$ and their inversion signals $\overline{A_1}$–$\overline{A_n}$, respectively, are electrically connected to ground $V_{SS}$ by transistor Tr10.

At time $t_3$ when the address signal designating word line WL1 is inputted, the potential on connecting line N1 is held at the H level potential set in the period during which precharge signal PRE is at the L level, as shown by a reference numeral ① in FIG. 3(c), in only circuit block 300a provided corresponding to word lines WL1 and WL2, in normal row decoder 203a. On the other hand, in preliminary row decoder 204b, if there are no defects in memory cells provided corresponding to word lines WL1 and WL2, the potential on connecting line N2 remains at the L level until precharge signal PRE falls to the L level, as shown by a reference numeral ② in FIG. 3(c), since none of fuses f1–f(2n) are cut. If the potential on connecting line N2 (the potential of normal decoder deactivating signal NED) attains the L level, address signal $RX_0$ at the H level and its inversion signal $\overline{RX_0}$ appear on respective outputs $X_0$ and $\overline{X_0}$ of NOR gates 2 and 3, respectively, in response to the potential on connecting line N1 remaining at the H level even after the input of an address signal, in circuit block 300a.

Since the potential of normal decoder deactivating signal NED is at the H level during the period for which precharge signal PRE is at the L level, respective outputs $X_0$ and $\overline{X_0}$ of NOR gates 2 and 3 receiving normal decoder deactivating signal NED are both at the L level. Accordingly, output $X_0$ of NOR gate 2 rises to the H level after the potential on connecting line N2 falls, as shown by a reference numeral ① in FIG. 3(d). Conversely, output $\overline{X_0}$ of NOR gate 3 is held at the L level even after the potential on connecting line N2 falls, as shown by a reference numeral ② in FIG. 3(d).

When the potential on connecting line N1 attains the H level, and output $X_0$ of NOR gate 2 attains the H level, circuit block 400a included in normal word driver 204a raises only the potential on word line WL1 to the H level. Accordingly, the potential on word line WL1 rises to the H level in response to the rise of output $X_0$ of NOR gate 2, as shown by a reference numeral ① in FIG. 3(e).

When the potential on connecting line N2 falls, preliminary word driver 204b selects neither spare word line SWL1 nor SWL2, and makes the potentials on those spare word lines attain the L level. Accordingly, all the potentials on spare word lines SWL1 and SWL2 and on unselected word lines WL2–WLm other than normal word line WL1 remain at the L level even after the input of address signal $RX_0$ and its inversion signal $\overline{RX_0}$, as shown by a reference numeral ② in FIG. 3(e).

In the above-described manner, if access is made to the memory cells provided corresponding to word line WL1, for example, only the potential on word line WL1 attains the H level at time $t_4$. When this access to the memory cells is then completed, all address signals $A_1$–$A_n$, $RX_0$ and their inversion signals $\overline{A_1}$–$\overline{A_n}$, $\overline{RX_0}$ again return to the L level (see FIG. 3(b)). In response to this, the potential of output $X_0$ of NOR gate 2 also falls to the L level. As a result, the potential on the selected word line WL1 also returns to the L level, so that all the normal word lines and spare word lines are deactivated.

When a defect is detected in any of the memory cells provided corresponding to word lines WL1 and WL2, and fuses f1–f (2n) are selectively cut in advance in preliminary row decoder 203b, the potential on connecting line N2 is held at the H level in response to an applied address signal designating word line WL1, for example, even after precharge signal PRE rises to the H level, as shown by ① in FIG. 3(c). Accordingly, normal decoder deactivating signal NED attains the H level, so that both outputs $X_0$ and $\overline{X_0}$ of NOR gates 2 and 3 attain the L level in each of the circuit blocks constituting normal row decoder 203a, as shown by ② in FIG. 3(d). Thus, all word lines WL1–WLm in normal memory array 201 remain at the L level even after the input of the address signal, as shown by ② in FIG. 3(e).

Conversely, preliminary word driver 204b raises only the potential on spare word line SWL1 in accordance with address signal $RX_0$ of the H level in response to the potential on connecting line N2 remaining at the H level even after the input of an address signal, as shown by ① in FIG. 3(e). As a result, spare word line SWL1 provided corresponding to undefective preliminary memory cells is automatically selected in place of the word line WL1 which is to be inherently selected.

The foregoing descriptions have been made as to the operation of normal row decoder 203a, normal word driver 204a, preliminary row decoder 203b and preliminary word driver 204b in the normal operation when spare enable signal SE is at the L level.

Figure 4:
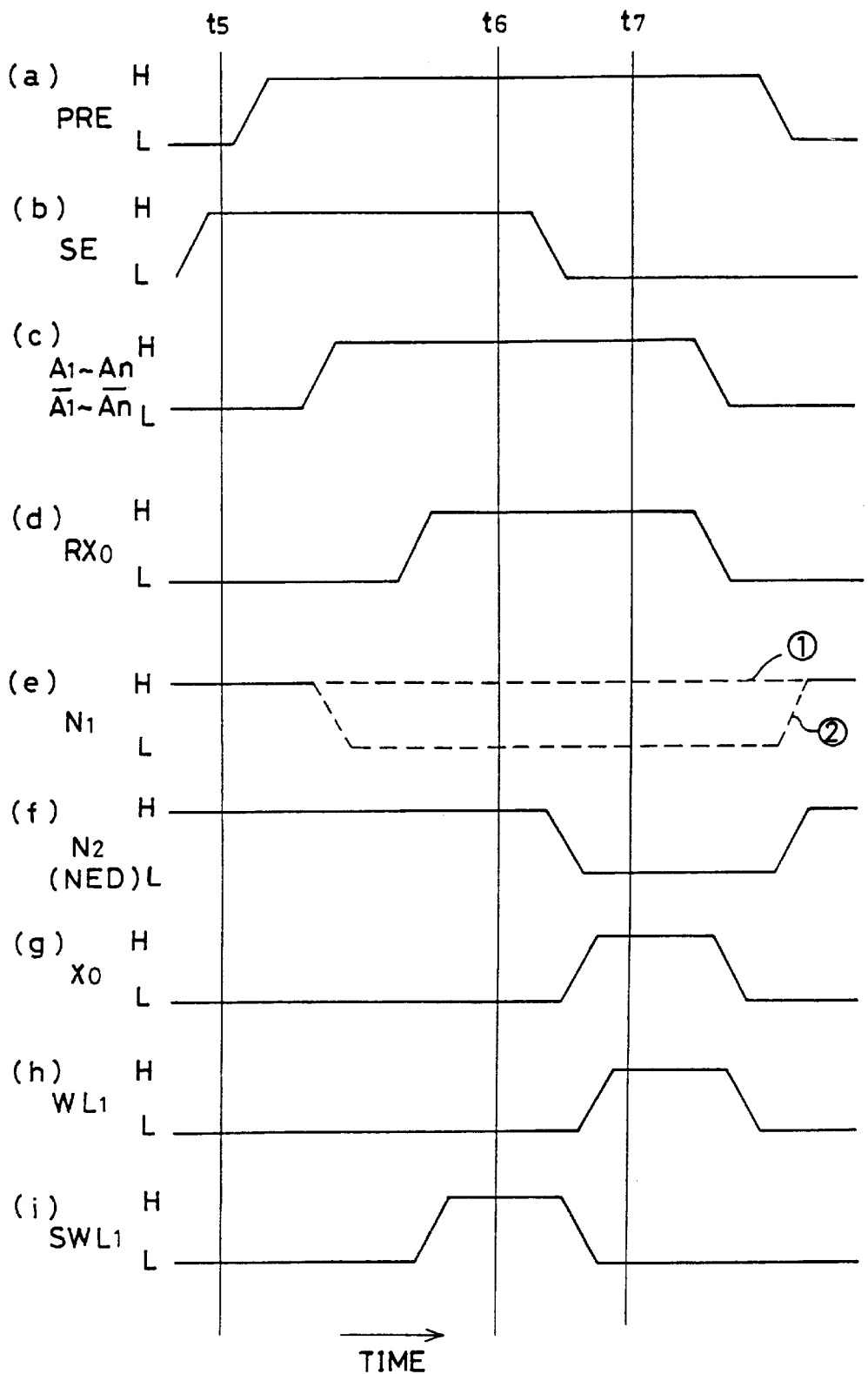

A description will now be made as to the function of this semiconductor memory device realized by changes in potential level of spare enable signal SE, with reference to FIGS. 4 and 5. FIG. 4 is a time chart showing the operation of normal row decoder 203a, normal word driver 204a, preliminary row decoder 203b and preliminary word driver 204b when data is transferred from the preliminary memory array to the normal memory array. FIG. 5 is a time chart showing the operation of normal row decoder 203a, normal word driver 204a, preliminary row decoder 203b and preliminary word driver 204b when data is transferred from the normal memory array to the preliminary memory array.

When data transfer is made from the preliminary memory array to the normal memory array, spare enable signal SE is at the H level for a predetermined period as shown in FIG. 4(b). Immediately after spare enable signal SE rises, precharge signal PRE attains the H level for a predetermined period longer than the period when spare enable signal SE is at the H level, as shown in FIG. 4(a). Address signals $A_1$–$A_n$ are then input after precharge signal PRE rises. That is, at least one of address signals $A_1$–$A_n$ and their inversion signals $\overline{A_1}$–$\overline{A_n}$ rises to the H level after the rise of precharge signal PRE (see FIG. 4(c)).

Address signal $RX_0$ is then input slightly later than address signals $A_1$–$A_n$. Thus, if address signal $RX_0$ serves to designate word line WL1, for example, the address signal $RX_0$ attains the H level after at least one of address signals $A_1$–$A_n$ and inversion signals $\overline{A_1}$–$\overline{A_n}$ rises, as shown in FIG. 4(d).

When spare enable signal SE attains the H level at time $t_5$, an output of NOR gate 5 attains the L level independently of the potential level of the inversion signal $\overline{PRE}$ of precharge signal PRE in preliminary row decoder 203b. Accordingly, transistor Tr10 is turned off. Since the inversion signal $\overline{SE}$ of spare enable signal SE attains the L level at the same time, transistor Tr11 is rendered conductive. As a result, even after precharge signal PRE rises, the potential on connecting line N2 (the potential of normal decoder deactivating signal NED) is held at the H level independently of whether fuses f1–f(2n) are cut or not, as shown in FIG. 4(f). If the potential on connecting line N2 is at the H level, the applied address signal $RX_0$ and inversion signal $\overline{RX_0}$ thereof are transmitted onto spare word lines SWL1 and SWL2, respectively, by preliminary word driver 204b. Accordingly, if the applied address signal serves to designate word line WL1, for example, the potential on spare word line SWL1 attains the H level in response to the rise of address signal $RX_0$, as shown in FIG. 4(i). In each of the circuit blocks constituting normal row decoder 203a, represented by circuit block 300a of FIG. 2, since normal decoder deactivating signal NED is at the H level even after the rise of precharge signal PRE, both outputs $X_0$ and $\overline{X_0}$ of NOR gates 2 and 3 attain the L level. No word lines in normal memory array 201 are activated even by any circuit blocks 400a constituting normal word driver 204a, represented by circuit block 400 of FIG. 2. As a result, storage data of each of preliminary memory cells of a single row provided corresponding to spare word line SWL1 is read onto the corresponding bit lines and then amplified by sensing circuit 205 of FIG. 1, at time $t_6$ when spare word line SWL1 is at the H level.

If an address signal designates word line WL1, the potential on connecting line N1 is held at the H level even after the address signal is input, as shown by ① in FIG. 4(e), in circuit block 300a provided corresponding to word lines WL1 and WL2 in normal row decoder 203a. The potential on connecting line N1 in each of circuit blocks provided corresponding to the other normal word lines WL3–WLm, however, falls to the L level in response to the input of the address signal, as shown by ② in FIG. 4(e).

When spare enable signal SE thereafter rises, precharge signal PRE is output from NOR gate 5 in preliminary row decoder 203b. Since precharge signal PRE is at the H level when spare enable signal SE falls, transistor Tr10 is rendered conductive in response to the fall of spare enable signal SE, thereby to lower the potential on connecting line N2 down to the L level (see FIG. 4(f)). Accordingly, the potential on spare word line SWL1 is lowered to the L level by transistor Tr17 in preliminary word driver 204b (see FIG. 4o(i)). The potential on spare word line SWL2 is also lowered to the L level by transistor Tr9.

In response to normal decoder deactivating signal NED attaining the L level, an address signal $RX_0$ at the H level and its inversion signal $\overline{RX_0}$ appear on respective outputs $X_0$ and $\overline{X_0}$ of NOR gates 2 and 3, respectively, in circuit block 300a provided corresponding to word lines WL1 and WL2 in normal row decoder 203a. As a result, output $X_0$ of NOR gate 2 attains the H level in response to the fall of normal decoder deactivating signal NED, as shown in FIG. 4(g). In response to this, the potential on word line WL1 attains the H level in response to the application of address signal $RX_0$, as shown in FIG. 4(h). More specifically, any spare word lines are not selected, and only the potential on normal word line WL1 is raised to the H level by normal row decoder 203a and normal word driver 204a at time $t_7$ when normal decoder deactivating signal NED is at the L level. Thus, all the memory cells provided corresponding to word line WL1 are put in a state in which data applied to corresponding bit lines can be written therein at time $t_7$. Now, the amplified data read from each of the memory cells provided corresponding to spare word line SWL1 at time $t_6$ appear on common bit lines B1, $\overline{B1}$, . . . , Bl, $\overline{Bl}$ of normal memory array 201 and preliminary memory array 202 in FIG. 1. Therefore, the data of preliminary memory cells of a single row, which are provided corresponding to spare word line SWL1 and appear on bit lines B1, $\overline{B1}$, . . . , Bl, $\overline{Bl}$, are transferred via corresponding bit lines to be written into the normal memory cells of a single row provided corresponding to word line WL1.

When the above-described writing is thereafter completed, all address signals $A_1$–$A_n$, $\overline{RX_0}$ and their inversion signals $\overline{A_1}$–$\overline{A_n}$, $\overline{RX_0}$ attain the L level to be put in the address-deactivated state. In response to this, output $X_0$ of NOR gate 2 falls to the L level. As a result, the potential on word line WL1 also attains the L level, so that word line WL1 becomes deactivated. Thereafter, precharge signal PRE again attains the L level, so that connecting lines N1 and N2 are precharged. This causes normal decoder deactivating signal NED to return to the H level.

When an address signal designating a word line provided corresponding to defective memory cells is applied, the potential on connecting line N2 is kept at the H level in preliminary row decoder 203b even if spare enable signal SE falls. Accordingly, if address signal $RX_0$ is at the H level, for example, the potential on spare word line SWL1 is at the H level at time $t_7$ in FIG. 4. Conversely, the potentials on all the word lines connected to normal word driver 204a are at the L level. Therefore, in this case, data which is read at time $t_6$ from preliminary memory cells of a single row provided corresponding to a single spare word line selected in response to address signal $RX_0$ is written again into the same memory cells at time $t_7$.

As described above, when data is transferred from the preliminary memory array to the normal memory array, storage data of the preliminary memory cells of a single row provided corresponding to a single spare word line selected in response to address signal $RX_0$ are simultaneously read and then simultaneously written into the normal memory cells of a single row provided corresponding to a single normal word line selected in response to address signals $A_1$–$A_n$ and $RX_0$. That is, in FIG. 1, data can be written simultaneously into the memory cells of a single row in normal memory array 201 during a period corresponding to one read cycle (or one refresh cycle) in which data is read from one memory cell in preliminary memory array 202. Accordingly, if different data are written in advance in the adjacent memory cells of a single row connected to a spare word line, different data in the direction of word lines, which are employed for functional testing of the normal memory array, can rapidly be written into the normal memory cells of a single row in response to storage data of the memory cells of the single row. More specifically, even if different data in the direction of word lines are required to be applied for the functional testing (e.g., when a leak between adjacent memory cells is detected), data for testing is written at high speed, thereby to reduce test time.

Thus, if data is written in advance into preliminary memory array 202 in accordance with a pattern of data which is to be written in normal memory array 201 for testing thereof, data for functional testing can be rapidly written in a desired pattern into the normal memory array as in the above-described manner employing spare enable signal SE.

In order to write data in an arbitrary pattern into preliminary memory array 202, normal data writing should be carried out in such a manner that the memory cells in preliminary memory array 202 may be selected one by one by column decoder 207, preliminary row decoder 203b and preliminary word driver 204b, with spare enable signal SE attaining the H level, so as to disable normal row decoder 203a and normal word driver 204a.

When the same data is written into all the memory cells connected to a single spare word line in preliminary memory array 202, however, spare enable signal SE should attain the H level so that the potential based on the data to be written may be applied to all bit lines B1, $\overline{B1}$, . . . , Bl, $\overline{Bl}$. That is, if spare enable signal SE attains the H level, a single spare word line SWL1 or SWL2 selected in response to address signal $RX_0$ attains the H level, so that data applied from input/output circuit 208 of FIG. 1 are simultaneously written via either bit lines B1–B1 or $\overline{B1}$–$\overline{Bl}$ into the preliminary memory cells connected to the single spare word line. As described above, the employment of spare enable signal SE makes it possible to simultaneously write the same data into the memory cells of one row in preliminary memory array 202. Thus, in case where storage data of the memory cells in normal memory array 201 are all unified to attain either the H level or the L level (all clear), if data of either the H level or the L level is written into preliminary memory array 202 by employing spare enable signal SE as described above, and thereafter the potential level of spare enable signal SE and that of precharge signal PRE change and an address signal is input at the timing shown in FIG. 4, the data of either the H level or the L level is written into the memory cells in normal memory array 201 in the time corresponding to m read cycles. In other words, normal memory 201 array can also be all cleared at high speed according to this embodiment.

Next, in the case of data transfer from the normal memory array to the preliminary memory array, opposite from the former case, spare enable signal SE (FIG. 5(b)) is at the H level for a definite period in the latter half of the period during which precharge signal PRE (FIG. 5(a)) is at the H level. Since address signals $A_1$–$A_n$ are input after precharge signal PRE rises, at least one of address signals $A_1$–$A_n$ and their inversion signals $\overline{A_1}$–$\overline{A_n}$ attains the H level after the rise of precharge signal PRE (see FIG. 5(c)). Address signal $RX_0$ is input slightly earlier than in the former case. Accordingly, if address signal $RX_0$ serves to designate word line WL1, address signal $RX_0$ rises slightly earlier than in the former case, as shown in FIG. 5(d).

When an address signal serves to designate word line WL1, the potential on connecting line N1 is held at the H level even after the address signal is input, in circuit block 300a provided corresponding to word lines WL1 and WL2 in normal row decoder 203a, as shown by a reference numeral ① in FIG. 5(e). The potential on connecting line N1 in each of circuit blocks provided corresponding to the other normal word lines WL3–WLm, however, falls to the L level in response to the input of the address signal, as shown by a reference numeral ② in FIG. 5(e).

In the period between time $t_8$ when precharge signal PRE rises and time $t_9$ when spare enable signal SE rises, transistors Tr11 and Tr12 are nonconductive, and NOR gate 5 outputs the potential of precharge signal PRE (the H level), to render transistor Tr10 conductive, in preliminary row decoder 203b. Accordingly, the potential on connecting line N2 (normal decoder deactivating signal NED) is at the L level in this period between $t_8$ and $t_9$, as shown in FIG. 5(f). As a result, in preliminary word driver 204b, transistor Tr17 is rendered conductive, so that the potential on spare word line SWL1 (FIG. 5(i)) attains the L level. Transistor Tr18 is also rendered conductive, so that the potential on spare word line SWL2 also attains the L level. Address signal $RX_0$ and inversion signal $\overline{RX_0}$ thereof appear on respective outputs $X_0$ and $\overline{X_0}$ of NOR gates 2 and 3, respectively, in circuit block 300a provided corresponding to normal word lines WL1 and WL2 in normal row decoder 203a. Thus, output $X_0$ of NOR gate 2 attains the H level in response to the rise of address signal $RX_0$ as shown in FIG. 5(g). In response to this, the potential on word line WL1 (FIG. 5(h)) attains the H level. As mentioned above, only normal word line WL1 is activated, and neither spare word line SWL1 nor SWL2 is activated in this period $t_8$–$t_9$.

When spare enable signal SE attains the H level at time $t_9$, the output of NOR gate 5 attains the L level independently of the potential level of inversion signal $\overline{PRE}$ of precharge signal PRE in preliminary row decoder 203b. Accordingly, transistor Tr10 is turned off. Simultanouesly, since inversion signal $\overline{SE}$ of spare enable signal SE attains the L level, transistor Tr11 is rendered conductive. As a result, the potential on connecting line N2 (the potential of normal decoder deactivating signal NED) is held at the H level in the period between time $t_9$ when spare enable signal SE rises and time $t_{10}$ when spare enable signal SE falls, independently of whether or not fuses f1–f(2n) are cut, as shown in FIG. 5(f). If the potential on connecting line N2 is at the H level, address signal $RX_0$ and its inversion signal $\overline{RX_0}$ are transmitted onto spare word lines SWL1 and SWL2, respectively, by preliminary word driver 204b. Accordingly, if an applied address signal designates word line WL1, for example, the potential on spare word line SWL1 attains the H level in response to the rise of normal decoder deactivating signal NED, as shown in FIG. 5(i). On the other hand, in each of the circuit blocks constituting normal row decoder 203a, represented by circuit block 300a of FIG. 2, both outputs $X_0$ and $\overline{X_0}$ of NOR gates 2 and 3 attain the L level. Thus, none of the word lines in normal memory array 201 are activated even by any of circuit blocks 400a constituting normal word driver 204a, represented by circuit block 400 of FIG. 2. As described above, only spare word line SWL1 is activated, and none of normal word lines WL1–WLm are activated in the period $t_9$-$t_{10}$.

Therefore, data which are read from all the memory cells connected to normal word line WL1 activated in the first half period $t_8$-$t_9$ of the period $t_8$-$t_{10}$ for which precharge signal PRE is at the H level, onto corresponding bit line pairs, are written into all the memory cells connected to spare word line SWL1 activated in the latter half $t_9$-$t_{10}$ of the period $t_8$-$t_{10}$.

When this writing is completed, address signals $A_1$–$A_n$, $RX_0$ and their inversion signals $A_1$–$A_n$, $\overline{RX_0}$ all attain the L level to be put in the address-deactivated state. In response to the fall of address signal $RX_0$, the potential on spare word line SWL1 falls to the L level, so that spare word line SWL1 becomes deactivated. Thereafter precharge signal PRE again attains the L level, so that connecting lines N1 and N2 are precharged to the H level. Accordingly, normal decoder deactivating signal NED also returns to the H level.

When an address signal designating a word line provided corresponding to defective memory cells is applied, the potential on connecting line N2 is held at the H level in preliminary row decoder 203b in the period $t_8$-$t_9$ for which spare enable signal SE is at the L level. Accordingly, if address signal $RX_0$ is at the H level, for example, the potential on spare word line SWL1 is at the H level during the period $t_8$-$t_9$. Conversely, the potentials on all the word lines connected to normal word driver 204a are at the L level. More specifically, one of spare word lines SWL1 and SWL2 is activated in response to address signal $RX_0$ in place of the normal word line. Accordingly, in this case, data read from memory cells of a single row connected to the spare word line corresponding to address signal $RX_0$ during the period $t_8$-$t_9$ are rewritten into the same memory cells in the period $t_9$-$t_{10}$.

As has been mentioned in the foregoing, when data transfer is made from the normal memory array to the preliminary memory array, with reference to FIG. 2, the same data as storage data of the memory cells of a single row in normal memory array 201 can be written simultaneously into the memory cells of a single row in preliminary memory array 202 during the period corresponding to one read cycle (or one refresh cycle) in which data is read from one memory cell in normal memory array 201. Therefore, if arbitrary address signals $A_1$–$A_n$ and $RX_0$ are applied, and spare enable signal SE is raised at the above timing, the data pattern of an arbitrary row in the preliminary memory array is rapidly changed to the data pattern of an arbitrary row in the normal memory array. This makes it possible to change the storage data of preliminary memory array 202 and to return data for functional testing, which is once written in normal memory array 201, to preliminary memory array 201 in shorter time. In this embodiment, since there are two spare word lines, storage data of preliminary memory cells of one row connected to different spare word lines can be written into memory cells of different rows in the normal memory cell in opposite cases where an applied address signal $RX_0$ is at the L level and where it is at the H level. Thus, if data is previously written in different patterns into a row corresponding to spare word line SWL1 and that corresponding to spare word line SWL2, the data pattern of the row which is data-transferred from memory cells corresponding to the one spare word line SWL1 is different from the data pattern of the row which is data-transferred from memory cells corresponding to the other spare word line SWL2, in the normal memory array after the data transfer. That is, the degree of freedom in the column direction of data patterns that can be written in the normal memory array at high speed is enhanced.

Further, if the number of spare word lines increases, and correspondingly the number of preliminary memory cells, preliminary row decoders and preliminary word drivers increases, more various types of data patterns can be written into normal memory cells at high speed. In this case, spare enable signal SE should be applied to each of the preliminary row decoders. With the number of spare word lines and preliminary memory cells increased, the redundancy of the semiconductor memory device is also enhanced. Accordingly, this method makes it possible to diversify data patterns for testing writable at high speed, with few demerits due to the reduction of the time required for a functional testing.

Figure 7:
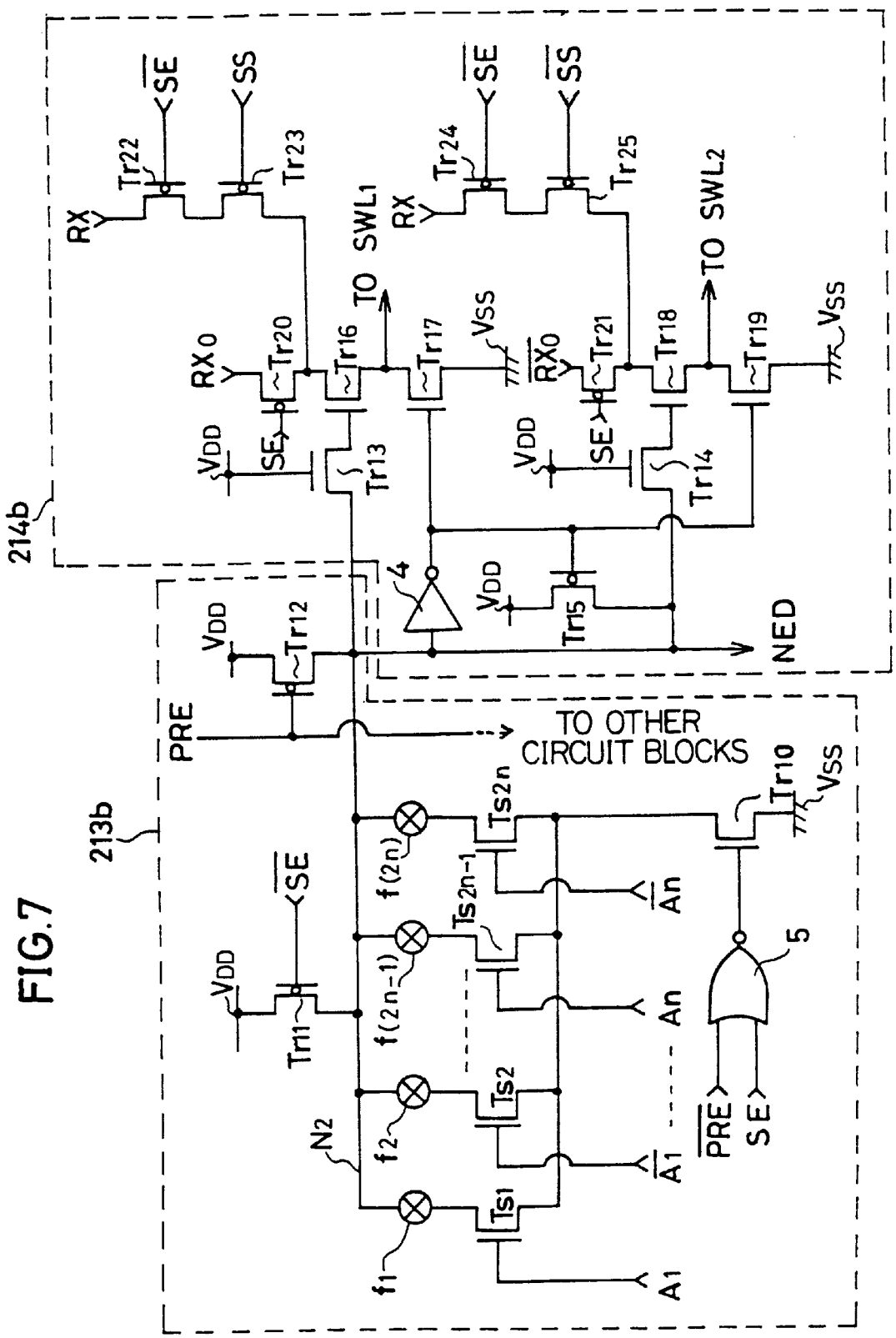
FIG. 7 is a circuit diagram of a preliminary row decoder and preliminary word driver illustrating another embodiment of the present invention.

Moreover, the degree of freedom of the data patterns for testing writable at high speed can be enhanced without an increase in the number of preliminary memory cells, spare word lines, preliminary row decoders, preliminary word drivers, etc. In the above-described embodiment, address signal $RX_0$ is employed to activate spare word line SWL1 or SWL2. Thus, a determination is uniquely made, in response to an address signal to be applied to the preliminary word drivers, as to into which rows of the normal memory array the storage data of rows corresponding to respective spare word lines SWL1 and SWL2 are transferred. This cannot be arbitrarily selected. If the degree of freedom of such selection is enhanced, the degree of freedom of the above-described data patterns can be enhanced. FIG. 7 is a circuit diagram showing the configuration of a preliminary row decoder and preliminary word driver in a semiconductor memory device according to another embodiment of the present invention, in which the diversification of data patterns is achieved from the above point of view. The entire structure of this semiconductor memory device and the configuration of a normal row decoder and normal word driver are the same as those in the former embodiment. Unlike the former embodiment, however, a spare select signal SS and a word line activating signal RX independent of an address are newly applied to the preliminary word driver.

With reference to FIG. 7, this preliminary row decoder 213b has the same configuration as preliminary row decoder 103b shown in FIG. 2. A preliminary word driver 214b, however, includes in addition to the circuit elements included in preliminary word driver 204b shown in FIG. 2, a P channel MOS transistor Tr20 connected in series to transistor Tr16, a P channel MOS transistor Tr21 connected in series to transistor Tr18, a series connection of P channel MOS transistors Tr22 and Tr23, connected to the connection point between transistors Tr16 and Tr20, and a series connection of P channel MOS transistors Tr24 and Tr25, connected to the connection point between transistors Tr18 and Tr21.

Transistor Tr20 is controlled in response to a spare enable signal SE to selectively transmit an address signal $RX_0$ to transistor Tr16. Similarly, transistor Tr21 is controlled in response to spare enable signal SE to selectively transmit an inversion signal $\overline{RX_0}$ of address signal $RX_0$ to transistor Tr18. Respective gates of transistors Tr22 and TR24 are supplied with an inversion signal $\overline{SE}$ of spare enable signal SE. Respective gates of transistors Tr23 and Tr25 are supplied with spare select signal SS and an inversion signal $\overline{SS}$ thereof, respectively. Word line activating signals RX are applied to one end of the series connection of transistors Tr22 and Tr23 and one end of the series connection of transistors Tr24 and Tr25. Word line activating signal RX has the H level of the potential level at which word lines are activated.

In the case of normal operation where spare enable signal SE is at the L level, transistors Tr20 and Tr21 are turned on, so that preliminary word driver 214b performs the same operation as preliminary driver 204b shown in FIG. 2. Therefore, a description on the operation of preliminary row decoder 213b and preliminary word driver 214b in normal operation will not be repeated.

When spare enable signal SE is at the H level, transistors Tr20 and Tr21 are turned off, so that transistors Tr16 and Tr18 are electrically separated from address signal $RX_0$ and inversion signal $\overline{RX_0}$ thereof, respectively. Since transistors Tr22 and Tr24 are turned on, word line activating signal RX is transferred by transistor Tr23 onto spare word line SWL1 if spare select signal SS is at the L level. Conversely, if spare select signal SS is at the H level, word line activating signal RX is transmitted to spare word line SWL2 by transistor Tr25. Accordingly, an arbitrary spare word line can be selected by spare select signal SS independently of an applied address signal. Thus, data of preliminary memory cells of a single row can be transferred to memory cells of an arbitrary row in the normal memory array. More specifically, the degree of freedom in a column direction (the direction of bit lines) of data patterns that can be written into the normal memory cells at high speed can be increased without an increase in the number of preliminary decoders and preliminary memory cells, in this embodiment. As a matter of course, if a larger number of spare word lines and preliminary memory cells are provided, and a plurality of preliminary row decoders 213b and preliminary word drivers 214b thus structured are employed, then the degree of freedom of the data patterns can further be increased.

Figure 8:
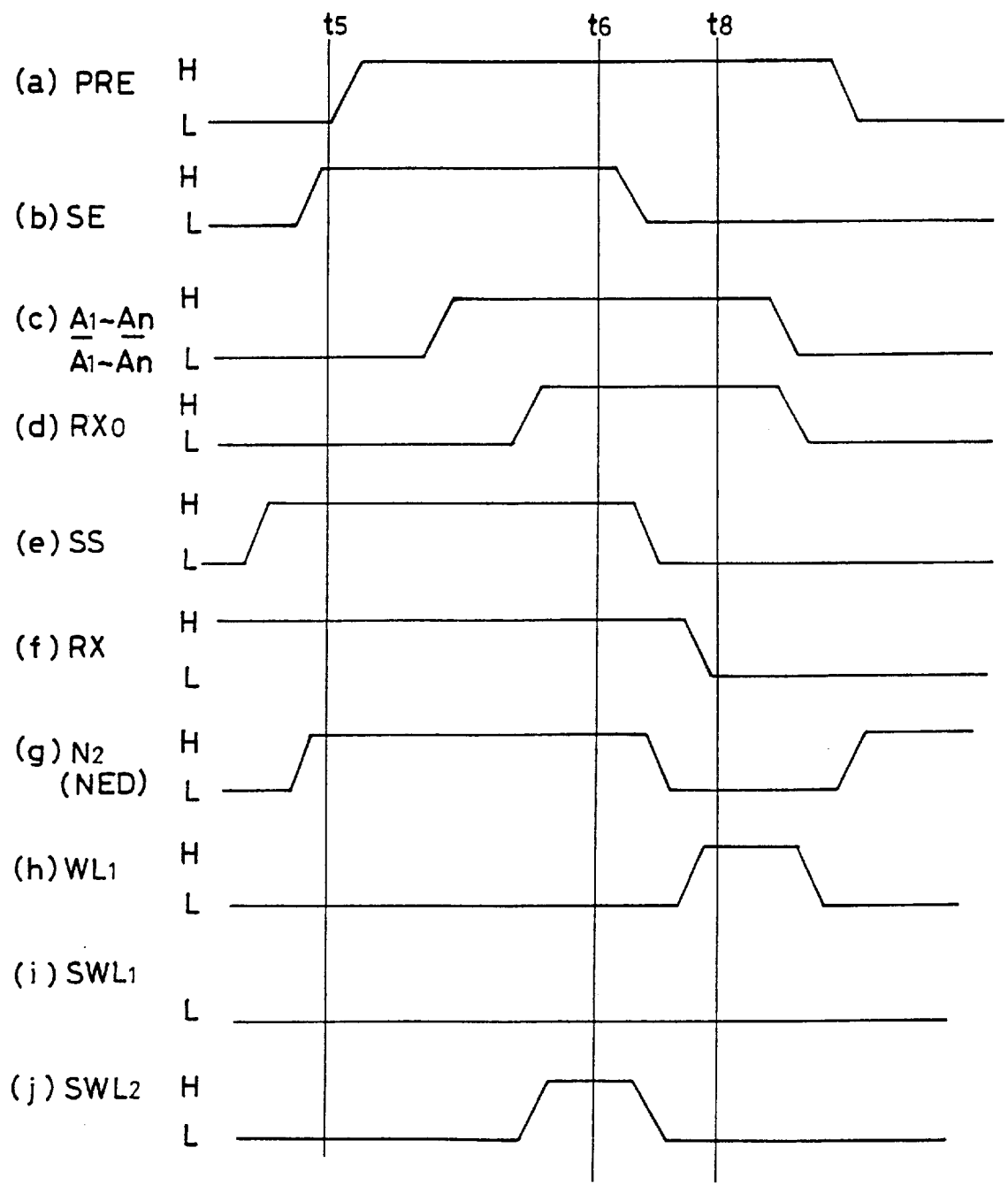
FIG. 8 is a time chart for explaining an operation of the circuitry shown in FIG. 6.

FIG. 8 is a time chart showing the potential change timing of each control signal, each connecting line and the like when data of memory cells connected to spare word line SWL2 in the preliminary memory array are transferred to memory cells connected to normal word line WL1 in the normal memory array, in this embodiment. With reference to FIG. 8, precharge signal PRE and spare enable signal SE attain the H level for a definite period at the same timing as in the case of the former embodiment (see FIGS. 8(a), (b)). Accordingly, normal decoder deactivating signal NED attains the L level in the latter half of the period when precharge signal PRE is at the H level, similarly to the case of the former embodiment (see FIG. 8(g)). Address signals $A_1$–$A_n$ and $RX_0$ designating normal word line WL1 are applied after precharge signal PRE rises. Thus, at least one of address signals $A_1$–$A_n$ and their inversion signals $\overline{A_1}$–$\overline{A_n}$, and address signal $RX_0$ also attain the H level for a definite period at the same timing as in the case of the former embodiment (see FIGS. 8(c), (d)). Spare select signal SS attains the H level for a definite period at the timing, for example, shown in FIG. 8(e). Word line activating signal RX (FIG. 8(f)) is at the H level at least during the period when spare enable signal SE is at the H level. Spare word line SWL2 is activated in the period when spare select signal SS, spare enable signal SE and normal decoder deactivating signal NED are all at the H level, i.e., the period when all transistors Tr18, Tr24 and Tr25 of FIG. 7 are in the ON state (see FIG. 8(j)). Since spare enable signal SE is at the L level in the period when spare select signal SS is at the L level, transistors Tr23 and Tr16 are in the ON state and transistor Tr22 are in the OFF state in FIG. 7. Thus, spare word line SWL1 is not activated (see FIG. 8(i)). Normal word line WL1 is activated in the period when normal decoder deactivating signal NED is at the L level and address signal $RX_0$ is at the H level, as shown in FIG. 8(h).

While the preliminary row decoder has both a redundancy function and a function of fast writing into the normal memory array in the foregoing two embodiments, a circuit block for implementing only the redundancy function can be provided separately, to separate the redundancy function from the functions of the preliminary row decoder. For example, if the structure of preliminary column decoder 203b of FIG. 2 is modified such that NOR gate 5 and transistor Tr11 may be removed and that precharge signal PRE may be applied directly to the gate of transistor Tr10, a preliminary column decoder having only the redundancy function can be obtained.

In the foregoing embodiments, spare enable signal SE serves to disable and enable a spare word line selecting operation of the preliminary row decoder, and spare select signal SS serves to select, independently of an address signal, an arbitrary spare word line which should be activated by the preliminary word driver. Spare enable signal SE, spare select signal SS and word line activating signal RX and its inversion signal are new signals accepted in addition to internal control signals (including PRE and NED) employed in the conventional semiconductor memory device. Those new signals may be externally applied, or alternatively, may be produced inside the memory device. In case where those signals are produced in the device, respective original signals SE', SS' and RX' of spare enable signal SE, spare select signal SS and word line activating signal RX are externally applied, and a test data writing control signal generating circuit 220 for generating internal control signals for writing test data is provided separately from a timing generator 210, as shown in e.g., FIG. 1. Timing generator 210 is a conventional circuit for generating conventional internal control signals in accordance with already existing external control signals (RAS, CAS, etc.). As a matter of course, internal control signals SE, SS, RX and their inversion signals for writing test data can also be produced from those already existing external control signals.

When the circuits having the configuration shown in FIGS. 2 or 6 are adopted as a preliminary row decoder and preliminary word driver, different data can be written as test data into adjacent memory cells in the row direction in the normal memory array at high speed, unlike the case of the conventional line testing. FIG. 6 is a diagram showing examples of data patterns which can be written into the normal memory array at high speed by data transfer from the preliminary memory array to the normal memory array by employing the preliminary row decoder and the preliminary word driver shown in FIG. 2. FIG. 9 is a diagram showing examples of data patterns which can be written into the normal memory array at high speed by data transfer from the preliminary memory array to the normal memory array by employing the preliminary row decoder and the preliminary row driver shown in FIG. 7.

In the tables shown in FIGS. 6 and 9, a lateral direction represents a row address corresponding to each word line, and a longitudinal direction represents a column address corresponding to each bit line. In the tables, data written into each memory cell corresponding to each of crossing points between the bit lines and the word lines are represented as a logic value "1" corresponding to data of the H level and as a logic value "0" corresponding to data of the L level.

In the preliminary and normal row decoders and the preliminary and normal word drivers shown in FIG. 2, a high-speed all clear function is implemented in which data of "1" or "0" is written into all the memory cells in the normal memory array at high speed, as shown in FIGS. 6(a) and (b). Also, as shown in FIG. 6(d), different data can be written into adjacent memory cells in the column direction at high speed. Further, as shown in FIGS. 6(c), (e) and (f), data can be written at high speed in such a pattern that data varies between adjacent memory cells in the row direction. In the preliminary row decoder and the preliminary word driver shown in FIG. 7, the same data or different data can be written at high speed into arbitrary adjacent memory cells in the respective directions of rows and columns in the normal memory array, as shown in e.g., FIGS. 9(a) and (b).

Figure 10:
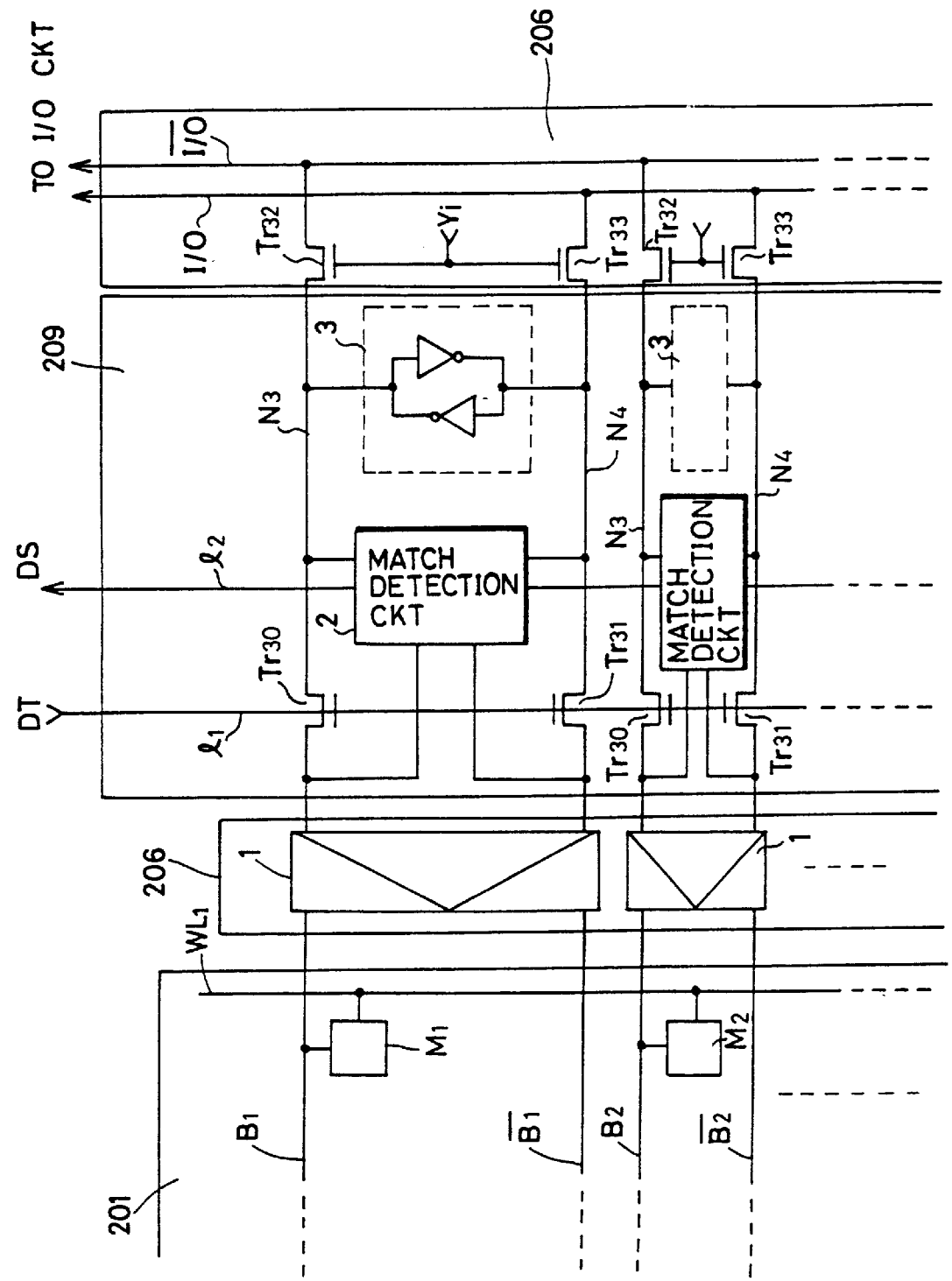
FIG. 10 is a circuit diagram showing the configuration of a circuit block 209 for testing in FIG. 1.

As described above, in the preliminary and normal row decoders and the preliminary and normal word drivers shown in FIGS. 2 and 7, different data can be written as testing data into the adjacent memory cells in the row direction in the normal memory array at high speed. In this case, however, a line testing cannot be carried out employing the conventional testing circuit shown in FIG. 13. Thus, the semiconductor memory device shown in FIG. 1 is structured such that the test data can be written into the normal memory array at high speed by employing the preliminary and normal row decoders and the preliminary and normal word drivers of the foregoing two embodiments, and also a functional testing can be carried out simultaneously for memory cells of a single row even if random test data are written in the row direction. That is, with reference to FIG. 1, a testing circuit block 209 which is disclosed in the article in "1989 Digest IEEE International Solid-State Circuit Conference", pp. 244–245 and 352, is provided between sensing circuit 206a and I/O control circuit 206b. FIG. 10 is a circuit diagram showing the configuration of testing circuit block 209 and peripheries thereof. With reference to FIG. 10, an I/O line pair (I/O, $\overline{I/O}$) and N channel MOS transistors Tr32 and Tr33 constitute I/O control circuit 206b; a sense amplifier 1 constitutes sensing circuit 206a; and bit line pairs B1 and $\overline{B1}$, B2 and $\overline{B2}$, . . . , a word line WL1 and memory cells M1, M2, . . . constitute a normal memory array 201. Sense amplifier 1 is provided corresponding to each bit line pair, and transfer N channel MOS transistors Tr32 and Tr33 are provided corresponding to two respective bit lines constituting each bit line pair. A match detecting circuit 2 and a register 3 provided corresponding to each bit line pair, and transfer N channel MOS transistors Tr30 and Tr31 together constitute the above-described testing circuit block 209. Bit line pair B1, $\overline{B1}$ is connected to sense amplifier 1, and memory cell M1 is connected to the cross-over point of bit line B1 and word WL1. Sense amplifier 1 is connected to match detecting circuit 2 and to one end of each of connecting lines N3 and N4 via transfer transistors Tr30 and Tr31 which receive a transfer signal DT from a signal line 11 through their gates. Connecting lines N3 and N4 are connected with match detecting circuit 2 and data register 3.

Register 3 includes two inverters each having its input connected to an output of the other inverter and is provided to temporarily hold an expected value input in line testing.

Match detecting circuit 2 includes an EXOR circuit for detecting the match/mismatch between the expected value held in register 3 and data stored in memory cell M1.

The respective other ends of connecting lines N3 and N4 are connected to I/O line pair I/O, $\overline{I/O}$ via transfer transistors Tr32 and Tr33, respectively. Match detecting circuit 2 is connected with a signal line 12 for outputting a signal DS representing a result of the line testing. Transfer transistors Tr32 and Tr33 are controlled in response to select signal Yi output from a column decoder (not shown) so as to select a bit line pair corresponding to an address signal.

In normal data writing, a potential corresponding to input data accepted by an input/output circuit (not shown) is applied to I/O line pair I/O, $\overline{I/O}$. A signal Yi of the H level is then applied as an output from column decoder 207 of FIG. 1 to transistors Tr32 and Tr33 connected to a pair of bit lines corresponding to the address signal. If an address signal designating memory cell M1 is applied, for example, the select signal Yi of the H level is applied from the column decoder to the respective gates of transistors Tr32 and Tr33 provided corresponding to bit line pair B1, $\overline{B1}$. Accordingly, transistors Tr32 and Tr33 are rendered conductive, so that potentials on the lines $\overline{I/O}$ and I/O are transmitted onto connecting lines N3 and N4, respectively. At this time, the transfer signal DT of the H level is applied to signal line 11, and input data transmitted to connecting lines N3 and N4 is written via sense amplifier 1 into memory cell M1 provided corresponding to the cross-over point between bit line B1 and word line WL1 activated by a normal word driver (not shown).

In normal data reading from memory cell M1, for example, the select signal Yi of the H level is applied from column decoder 207 to the respective gates of transistors Tr32 and Tr33 provided corresponding to bit line pair B1, $\overline{B1}$. The transfer signal DT of the H level is applied to signal line 11, and word line WL1 is activated to be of the H level by a normal row driver (not shown).

The data read from memory cell M1 to bit line B1 is amplified by sense amplifier 1, so that the storage data of memory cell M1 and inversion data thereof appear on connecting lines N3 and N4, respectively. The data appearing on connecting lines N3 and N4 are applied to the input/output circuit via lines $\overline{I/O}$ and I/O, respectively.

An operation of this semiconductor device in line testing will now be described.

First, transfer signal DT attains the H level to render transistors Tr30 and Tr31 conductive. Then, test data is written into memory cells of a single row connected to a single normal word line (or a single spare word line) in the normal memory array (or the preliminary memory array) by the normal (or preliminary) row decoder and the normal (or preliminary) word driver shown in FIGS. 2 or 7. At this time, this written data appears on each bit line. Registers 3 latches the data written into normal memory cells of a single row (or spare memory cells of a single row). Then, a word line is selected by select signal Yi. Storage data of memory cells connected to the selected word line is read and then amplified by corresponding sense amplifier 1. Match detecting circuit 2 detects the match/mismatch between the read data and the data latch in register 3.

Match detecting circuit 2 outputs a result of the detection as a detection signal DS. This detection signal DS is output via signal line 12.

Since detecting circuit 2 and register 3 are both provided corresponding to each bit line pair, detecting circuit 2 makes a comparison between the read data from the memory cells connected to a corresponding bit line pair and the latch data in corresponding register 3, i.e., the data written as test data. Accordingly, in this testing circuit block 209, even if different data are written as test data into adjacent memory cells in the direction of word lines, a detection can be made at one time as to whether or not there are defects in memory cells of a signal row. As a result, in the semiconductor memory device of this embodiment, the time required for functional testing can be reduced from both aspects that the test data writing time is reduced by the structure of the preliminary and normal row decoders and the preliminary and normal word drivers shown in FIGS. 2 or 4 and that the defective memory cell detecting time is reduced by the above-described testing circuit block.

In testing circuit block 209 shown in FIG. 10, since match detecting circuit is provided for one bit line pair, a functional testing for memory cells connected to two bit lines constituting a bit line pair can be carried out only by a comparison with a single expected value. Thus, if a plurality of registers for latching expected values are provided for respective bit line pairs, a comparison can be made between storage data of memory cells connected to one bit line pair and a large number of expected values. This makes it possible to execute a functional testing employing various data patterns for testing at higher speed and thus require shorter test time.

In order to employ arbitrary data written in the direction of bit lines and the direction of word lines as expected values to be latched in registers 3, storage data of memory cells connected to a single word line or a single spare word line should be written simultaneously into corresponding registers.

Figure 11:
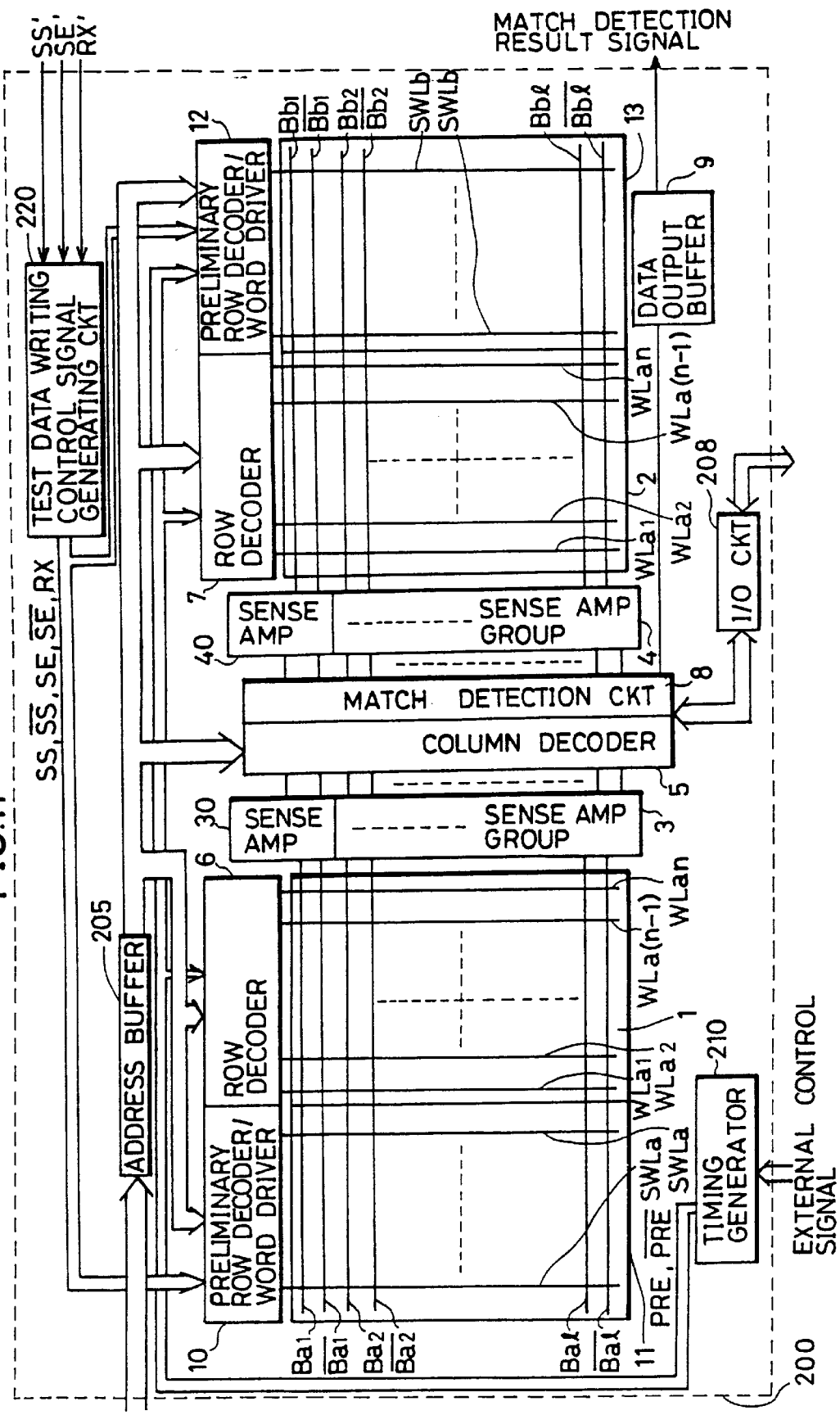
FIG. 11 is a schematic block diagram showing the entire structure of a semiconductor memory device according to still another embodiment of the present invention.

Japanese Patent Laying-Open No. 63-177394 discloses one example of another semiconductor memory device in which a functional testing can be carried out simultaneously with respect to memory cells of a single row even if random test data are written in the direction of rows. FIG. 11 is a schematic block diagram showing another example of a semiconductor memory device enabling a fast writing of data for testing and a simultaneous functional testing for memory cells of a single row, which can be implemented by application of the present invention to the semiconductor memory device disclosed in Japanese Patent Laying-Open No. 63-177394.

With reference to FIG. 11, this semiconductor memory device 200 includes row decoders 6 and 7 provided corresponding to two memory arrays 1 and 2, respectively, and sense amplifier groups 3 and 4. This semiconductor memory device further includes a column decoder 5 and a match detecting circuit 8 provided in common to memory arrays 1 and 2, and a data output buffer 9 for outputting a match detection result signal applied from match detecting circuit 8.

Memory arrays 1 and 2 each have the same configuration as the conventional. Like the case of FIG. 1, memory cells included in each of memory arrays 1 and 2 are not shown. Row decoders 6 and 7 serve also as word drivers. Therefore, row decoder 6 responds to an external address signal to selectively activate one of word lines $WL_a$–$WL_a n$ in memory array 1. Similarly, row decoder 7 responds to the above address signal to selectively activate one of word lines $WL_b 1$–$WL_b n$ in memory array 2. Accordingly, a single word line is activated simultaneously in each of memory arrays 1 and 2 in response to one address signal.

Column decoder 5 responds to an address signal to select a sense amplifier 30 provided corresponding to one of bit line pairs in memory array 1 from sense amplifier group 3 and, at the same time, select a sense amplifier 40 provided corresponding to a bit line pair in the same column as that corresponding to the bit line pair selected in memory array 1 from sense amplifier group 4. Further, column decoder 5 applies amplification outputs of selected sense amplifiers 30 and 40 as outgoing read data to an input/output buffer 208 in normal data reading, and applies write data from input/output buffer 208 to selected sense amplifiers 30 and 40 in normal data writing.

Sense amplifier group 3 includes sense amplifiers 30 provided one for each of bit line pairs $B_a 1$ and $\overline{B_a 1}$, $B_a 2$ and $\overline{B_a 2}$, ..., $B_a l$ and $\overline{B_a l}$ in memory array 1. Similarly, sense amplifier group 4 includes sense amplifiers 40 provided one for each of bit line pairs $B_b 1$ and $\overline{B_b 1}$, $B_b 2$ and $\overline{B_b 2}$, ..., $B_b l$ and $\overline{B_a l}$ in memory array 2. Sense amplifiers 30 and 40 amplify data appearing on corresponding bit line pairs in memory array 1 and data appearing on corresponding bit line pairs in memory array 2, respectively, to apply the amplified data to match detecting circuit 8. Therefore, in testing, storage data of memory cells of one row in memory array 1 and storage data of memory cells of one row in memory array 2, corresponding to the above one row in memory array 1 are read simultaneously. That is, the storage data of each of the memory cells of one row in memory array 1 is amplified by corresponding sense amplifier 30 in sense amplifier group 3 and then applied to match detecting circuit 8. Simultaneously, the storage data of each of the memory cells of the above-described corresponding one row in memory array 2 is amplified by corresponding sense amplifier 40 in sense amplifier group 4 and then applied to match detecting circuit 8.

Match detecting circuit 8 compares data applied from sense amplifier group 3 and that applied from sense amplifier group 4 in the relation of one to one and then outputs a match detection result signal corresponding to a result of this comparison. Specifically, match detecting circuit 8 outputs a match detection result signal of the H level when output data of all sense amplifiers 30 in sense amplifier group 3 match those of all sense amplifiers 40 in sense amplifier group 4. Then, if a confirmation is made that the output data mismatch each other between at least one sense amplifier 30 in sense amplifier group 3 and the corresponding sense amplifier 40 in sense amplifier group 4, match detecting circuit 8 outputs a match detection result signal of the L level.

As described above, in this semiconductor memory device, since the respective storage data of the memory cells of one row in the one memory array 1 are simultaneously compared with those of the corresponding memory cells in the other memory array 2, the match/mismatch of the storage data of the corresponding one-row memory cells between two memory arrays 1 and 2 is detected at the same time independently of storage data patterns of memory arrays 1 and 2.

Thus, in order to enable a fast test data writing into memory arrays 1 and 2 in addition to such a fast match detection, preliminary memory arrays 11 and 13 are provided corresponding to memory arrays 1 and 2, and preliminary row decoders/word drivers 10 and 12 are provided corresponding to row decoders 6 and 7 in this embodiment. Preliminary memory array 11 includes bit line pairs $B_a 1$, $\overline{B_a 1}$–$B_a l$, $\overline{B_a l}$ common to memory array 1, word lines $SWL_a$ separate from the word lines in memory array 1, and preliminary memory cells (not shown) provided corresponding to the cross-over points between those bit line pairs and spare word lines $SWL_a$. Similarly, memory array 13 includes bit line pairs $B_b 1$, $\overline{B_b 1}$–$B_b l$, $\overline{B_b l}$ common to memory array 2, spare word lines $SWL_b$ separate from the word lines in memory array 2, and preliminary memory cells (not shown) provided corresponding to the cross-over points between those bit line pairs and spare word lines $SWL_b$.

Preliminary row decoders/word drivers 10 and 12 each include the circuit shown in FIG. 2(b) or FIG. 7, for example, for every two spare word lines. Preliminary row decoders/word drivers 10 and 12 respond to the address signal to select one of spare word lines $SWL_a$ of preliminary memory array 11 and one of spare word lines $SWL_b$ of preliminary memory array 13, respectively, and then activate the selected respective spare word lines. Further, in this embodiment, row decoders 6 and 7 each include a normal row decoder and normal word driver having the configuration shown in FIG. 2(a), for example, and provided for every two word lines. Therefore, in this embodiment, two memory arrays 1 and 2 operate as normal memory arrays. Thus, if data is written in advance into preliminary memory array 11 in a pattern according to a test data pattern to be written into memory array 1, test data is transferred in a one-row unit from preliminary memory array 11 into memory array 1. Accordingly, the test data is written into memory array 1 at high speed. Similarly, if data is written in advance into preliminary memory array 13 in a pattern according to a test data pattern to be written into memory array 2, test data is transferred in a one-row unit from preliminary memory array 13 to memory array 2. Accordingly, the test data is written into memory array 2 at high speed. As described above, however, the functional testing of memory arrays 1 and 2 is carried out by a confirmation of the match between data read from memory array 1 and that from memory array 2. Thus, the test data pattern to be written into memory array 1 must be identical to that to be written into memory array 2. Since preliminary row decoders/word drivers 10 and 12 select their corresponding spare word lines in response to the same address signal, however, the same data pattern is written in advance into preliminary memory arrays 11 and 13. Therefore, the pattern of data written into memory array 1 by data transfer from preliminary memory array 11 to memory array 1 matches that of data written into memory array 2 by data transfer from preliminary memory array 13 to memory array 2. Since one word line is selected simultaneously from each of normal memory arrays 1 and 2, in this embodiment, the time required for writing test data into the normal memory array is further reduced.

As has been described in the foregoing, according to this embodiment, after test data of an arbitrary pattern is written at high speed into two blocks constituting a normal memory array, a comparison is made between storage data of one row of the one block and storage data of one row of the other block, thereby enabling a functional testing for the normal memory array. Accordingly, a fast writing of test data into the normal memory array and a fast reading of data from the normal memory array to perform the functional testing of the normal memory array are achieved, resulting in a substantial reduction in test time. Furthermore, in this embodiment, unlike the embodiment shown in FIGS. 1 and 10, it is unnecessary to provide a circuit such as a register or the like for storing expected data for a comparison with data read from the normal memory array, in order to perform the functional testing. Therefore, in this embodiment, the required test time can further be decreased while a chip area of the semiconductor memory device is reduced.

Since a specific example of the circuit configuration of match detecting circuit 8 in this embodiment is shown in Japanese Patent Laying-Open No. 63-177394, a description thereof is deleted.

While the preliminary row decoder and the normal row decoder select two spare word lines and two normal word lines, respectively for simplification in any of the foregoing embodiments, the number of word lines to be selected by the row decoders is not limited to this but may be 4, 8, 16 lines, etc.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells each connected to word lines and bit lines and arranged in matrix in the direction of rows and the direction of columns;
   a plurality of preliminary memory cells each connected to preliminary word lines and said bit lines and arranged in matrix in said direction of rows and said direction of columns; and
   transfer means for simultaneously transferring storage data of either said memory cells of a single row connected to one of said word lines or said preliminary memory cells of a single row connected to one of said preliminary word lines to the other said memory cells or said preliminary memory cells via said bit lines,
   said transfer means including:
   (a) first reading means for simultaneously reading onto said bit lines the storage data of said preliminary memory cells of a single row connected to said one preliminary word line;
   (b) first selecting/activating means responsive to the reading by said first reading means for (1) selecting one of said word lines and (2) activating the selected word line, said first selecting/activating means including:
      (i) word line selecting means for selecting one of said word lines,
      (ii) word line activating means for activating said one word line selected by said word line selecting means, and
      (iii) first control means for controlling said word line selecting means and said word line activating means to be enabled or disabled,
   (c) second reading means for simultaneously reading onto said bit lines the storage data of said memory cells of a single row connected to said one word line, and
   (d) second selecting/activating means responsive to the reading by said second reading means for selecting said one preliminary word line to activate the selected preliminary word line, said second selecting/activating means including:
      (i) preliminary word line selecting means for selecting one of said preliminary word lines, said preliminary word line selecting means including preliminary word line selecting signal outputting means responsive to a first external address signal for outputting a preliminary word line selecting signal for selecting preliminary word lines of said preliminary word lines, said preliminary word line selecting signal outputting means having means responsive to said first external address signal for outputting said preliminary word line selecting signal independent of the forcing by first forcing means,
      (ii) preliminary word line activating means for activating said one preliminary word line selected by said preliminary word line selecting means, said preliminary word line activating means including preliminary word line activating signal applying means responsive to said preliminary word line selecting signal from said preliminary word line selecting signal outputting means and a second external address signal for applying to one of said selected preliminary word lines corresponding to said second address signal, an activating signal for activating the corresponding preliminary word line, and (iii) second control means for controlling said preliminary word line selecting means and said preliminary word line activating means to be enabled or disabled, said second control means including said first forcing means responsive to a first control signal for forcing an output of said preliminary word line selecting signal outputting means to a non-selecting signal for selecting neither of said preliminary word lines, said first reading means and said second reading means comprising amplifying means for amplifying a potential change on each of said bit lines, wherein:

(i) a potential on said bit line connected to an arbitrary memory cell of said memory cells changes dependently on storage data of said arbitrary memory cell in response to activation of said word line connected to said arbitrary memory cell, and (ii) a potential on said bit line connected to an arbitrary memory cell of said preliminary memory cells changes dependently on storage data of said arbitrary preliminary memory cell in response to activation of said preliminary word line connected to said arbitrary preliminary memory cell.

2. A semiconductor memory device comprising:

a plurality of memory cells each connected to word lines and bit lines and arranged in matrix in the direction of rows and the direction of columns;

a plurality of preliminary memory cells each connected to preliminary word lines and said bit lines and arranged in matrix in said direction of rows and said direction of columns; and transfer means for simultaneously transferring storage data of either said memory cells of a single row connected to one of said word lines or said preliminary memory cells of a single row connected to one of said preliminary word lines to the other said memory cells or said preliminary memory cells via said bit lines, said transfer means including:

(a) first reading means for simultaneously reading onto said bit lines the storage data of said preliminary memory cells of a single row connected to said one preliminary word line;

(b) first selecting/activating means responsive to the reading by said first reading means for (i) selecting one of said word lines and (ii) activating the selected word line, said first selecting/activating means including:

(i) word line selecting means for selecting one of said word lines, (ii) word line activating means for activating said one word line selected by said word line selecting means, and (iii) first control means for controlling said word line selecting means and said word line activating means to be enabled or disabled, (c) second reading means for simultaneously reading onto said bit lines the storage data of said memory cells of a single row connected to said one word line, and (d) second selecting/activating means responsive to the reading by said second reading means for selecting said one preliminary word line to activate the selected preliminary word line, said second selecting/activating means including:

(i) preliminary word line selecting means for selecting one of said preliminary word lines, said preliminary word line selecting means including preliminary word line selecting signal outputting means responsive to a first external address signal for outputting a preliminary word line selecting signal for selecting preliminary word lines of said preliminary word lines, said preliminary word line selecting signal outputting means having means responsive to said first external address signal for outputting said preliminary word line selecting signal independent of the forcing by first forcing means, (ii) preliminary word line activating means for activating said one preliminary word line selected by said preliminary word line selecting means, said preliminary word line activating means including preliminary word line activating signal applying means responsive to said preliminary word line selecting signal from said preliminary word line selecting signal outputting means for applying to an arbitrary one of said selected preliminary word lines, an activating signal for activating said one preliminary word line, and (iii) second control means for controlling said preliminary word line selecting means and said preliminary word line activating means to be enabled or disabled, said second control means including said first forcing means responsive to a first control signal for forcing an output of said preliminary word line selecting signal outputting means to a non-selecting signal for selecting neither of said preliminary word lines, said first reading means and said second reading means comprising amplifying means for amplifying a potential change on each of said bit lines, wherein:

(i) a potential on said bit line connected to an arbitrary memory cell of said memory cells changes dependently on storage data of said arbitrary memory cell in response to activation of said word line connected to said arbitrary memory cell, and (ii) a potential on said bit line connected to an arbitrary memory cell of said preliminary memory cells changes dependently on storage data of said arbitrary preliminary memory cell in response to activation of said preliminary word line connected to said arbitrary preliminary memory cell.

3. A semiconductor memory device comprising:

a plurality of memory cells connected to word lines and bit lines and arranged in a matrix in the direction of rows and the direction of columns;

a plurality of preliminary memory cells connected to preliminary word lines and said bit lines and arranged in a matrix in said direction of rows and said direction of columns;

means for writing predetermined external data for functional testing of said plurality of memory cells into each single row of said plurality of preliminary memory cells;

storing means for temporarily storing said external data written by said writing means;

means for simultaneously transferring said external data in each single row of said preliminary memory cells connected to one of said preliminary word lines to a corresponding single row of said plurality of memory cells connected to one of said word lines via said bit lines connecting said plurality of memory cells and preliminary memory cells;

reading means for simultaneously reading data from each single row of said plurality of memory cells; and means for simultaneously comparing all of said data read by said reading means with all of said external data temporarily stored in said storing means via bit lines connecting said plurality of memory cells and preliminary memory cells, to detect whether or not there is a defect in any of the rows of said plurality of memory cells.

4. The semiconductor memory device according to claim 3, wherein:

said means for simultaneously comparing comprises means for comparing all of said read data and all of said temporarily stored external data in the correspondence of one to one.

5. The semiconductor memory device according to claim 3, further comprising:

means for supplying test data in parallel to a plurality of said memory cells connected in common to one of said word lines;

means for retrieving said test data in parallel from said plurality of said memory cell connected in common to said one of said word lines; and means for comparing said test data retrieved in parallel from said plurality of said memory cells with data stored in respective ones on said preliminary memory cells and, in response, supplying a test result signal.

6. The semiconductor memory device according to claim 3, further comprising memory cell replacement means responsive to an address signal for substituting a redundant row of said preliminary memory cells for a faulty row of said memory cells.

7. The semiconductor memory device according to claim 3, further comprising memory access means responsive to an address signal and to faulty memory cell data for selectively accessing (i) memory cells of said plurality of memory cells and (ii) memory cells of said preliminary memory cells.

8. A semiconductor memory device comprising:

a) a first memory array including:
   i) a plurality of first memory cells connected to first word lines and first bit lines and arranged in a matrix in the direction of rows and the direction of columns, and
   ii) a plurality of first preliminary memory cells connected to first preliminary word lines and said first bit lines and arranged in a matrix in said direction of rows and said direction of columns;

b) a second memory array including:
   i) a plurality of second memory cells connected to second word lines and second bit lines and arranged in a matrix in the direction of rows and the direction of columns, and
   ii) a plurality of second preliminary memory cells connected to second preliminary word lines and said second bit lines and arranged in a matrix in said direction of rows and said direction of columns;

c) means for simultaneously writing identical external data for functional testing of said first memory cells and said second memory cells into each row of said first preliminary memory cells and said second preliminary memory cells, respectively;

d) first transfer means for simultaneously transferring the external data in each row of said plurality of first preliminary memory cells connected to one of said first preliminary word lines into a corresponding row of said plurality of first memory cells connected to one of said first word lines via said first bit lines connecting said plurality of first memory cells and first preliminary memory cells;

e) second transfer means for simultaneously transferring the external data in each row of said plurality of second preliminary memory cells connected to one of said second preliminary word lines into a corresponding row of said plurality of second memory cells connected to one of said second word lines via said second bit lines connecting said plurality of second memory cells and second preliminary memory cells, wherein:

data transfer by said first transfer means is carried out simultaneously with data transfer by said second transfer means;

f) means for simultaneously reading data from each row of said plurality of first memory cells and from each row of said plurality of second memory cells; and g) means for comparing all the data read from each row of said plurality of first memory cells by said reading means and all the data read from each row of said plurality of second memory cells by said reading means with the external data, to detect whether or not there is a defect in any of the rows of said plurality of first memory cells and said plurality of second memory cells.

9. The semiconductor memory device according to claim 8, wherein:

said means for comparing comprises means for comparing all of said read data and all of said external data temporarily stored in said plurality of first and second preliminary memory cells in the correspondence of one to one.

10. The semiconductor memory device according to claim 8, further comprising memory cell replacement means responsive to an address signal for substituting a redundant row of said preliminary memory cells for a faulty row of said memory cells.

11. The semiconductor memory device according to claim 8, further comprising memory access means responsive to an address signal and to faulty memory cell data for selectively accessing (i) memory cells of said plurality of memory cells and (ii) memory cells of said preliminary memory cells.

12. A semiconductor memory device comprising:

memory arrays, each of said memory arrays comprising:
   a plurality of main memory cells and a plurality of preliminary memory cells arranged in matrix in the direction of rows and columns;
   word lines provided to said rows in which said plurality of main memory cells is arranged;
   preliminary word lines provided to said rows in which said plurality of preliminary memory cells is arranged;
   bit lines provided to said columns in which said plurality of main memory cells and preliminary memory cells are arranged;
   row decoding means for decoding an address signal designating respective ones of said rows and columns to select one of said word lines for selecting specific ones of said main memory cells;

preliminary row decoding means for decoding said address signal to select one of said preliminary word lines for selecting specific ones of said plurality of preliminary memory cells;

column decoding means for decoding said address signal to select one of said bit lines for reading and writing data to the specific ones of said plurality of main memory cells as well as to the specific ones of said plurality of preliminary memory cells;

sense amplifying means for amplifying the data on said bit lines selected by said column decoding means; and transfer means for simultaneously transferring data in a single row of either said plurality of main memory cells connected to one of said word lines selected by said row decoding means or said plurality of preliminary memory cells connected to one of said preliminary word lines selected by said preliminary row decoding means to another row of said plurality of main memory cells connected to one of said word lines selected by said row decoding means or said plurality of preliminary memory cells connected to one of said preliminary word lines selected by said preliminary row decoding means via said bit lines connecting said plurality of main memory cells and said plurality of preliminary memory cells; and comparing means for simultaneously comparing between data in a single row of said plurality of main memory cells connected to one of said word lines and data in the single row of said plurality of preliminary memory cells connected to one of said preliminary word lines via said bit lines connecting said plurality of main memory cells and preliminary memory cells to detect any memory cell defects.

13. The semiconductor memory device according to claim 12, further comprising memory cell replacement means responsive to said address signal for substituting a redundant row of said preliminary memory cells for a faulty row of said memory cells.

14. The semiconductor memory device according to claim 12, further comprising memory access means responsive to said address signal and to faulty memory cell data for selectively accessing (i) memory cells of said plurality of main memory cells and (ii) memory cells of said preliminary memory cells.

15. A semiconductor memory device having a self-test mode of operation and in a self-repair mode of operation, comprising:

a plurality of main memory cells connected to main word lines and bit lines and arranged in a matrix in the direction of rows and the direction of columns;

a plurality of spare memory cells connected to spare word lines and said bit lines and arranged in a matrix in said direction of rows and said direction of columns;

test means for operating in said self-test mode of operation including:
(i) transfer means for simultaneously transferring in parallel test data stored in a row of said plurality of spare memory cells of a selected one of said spare word lines to a respective row of said plurality of main memory cells of a selected one of said main word lines via said bit lines connecting said plurality of main memory cells and spare memory cells and storing said test data therein, and
(ii) comparator means for comparing said test data stored in said row of said plurality of spare memory cells with transferred data stored in said respective row of said plurality of main memory cells, and in response, supplying a test result signal; and faulty row substitution means responsive to said test result signal and an address signal applied to the semiconductor memory device for selectively supplying data from an addressed one of said main memory cells or from a respective replacement one of said spare memory cells as an output of the semiconductor memory device.

16. A semiconductor memory device comprising:
a) a plurality of memory cells connected to word lines and bit lines and arranged in a matrix in the direction of rows and the direction of columns;
b) a plurality of preliminary memory cells connected to preliminary word lines and said bit lines and arranged in a matrix in said direction of rows and said direction of columns;
c) means for receiving address signals of said plurality of memory cells and preliminary memory cells; and
d) transferring means for simultaneously transferring storage data in a single row of either said plurality of memory cells connected to one of said word lines or said plurality of preliminary memory cells connected to one of said preliminary word lines to other memory cells in a single row or other preliminary memory cells in a single row via said bit lines connecting said plurality of memory cells and preliminary memory cells, said transferring means comprising:
i) selecting means for selecting one of word line and preliminary word line in response to said address signals,
ii) enabling means for enabling said selecting means to select said word line and preliminary word line, and
iii) activating means for activating the transferring means, wherein when said transferring means is activated, said enabling means enables said selecting means to select both said word line and preliminary word line based on a common address signal.

17. The semiconductor memory device of claim 16, wherein said enabling means enables said selecting means to select said word line corresponding to said common address signal when said activating means is deactivated and said common address signal does not specify a defective memory cell in said plurality of memory cells.

18. The semiconductor memory device of claim 16, wherein said enabling means disables the selecting means for selecting said word line corresponding to said common address signal to select said preliminary word line corresponding to said common address signal when said activating means is deactivated and said common address signal does specify a defective memory cell in said plurality of memory cells.

19. The semiconductor memory device of claim 16 further comprising:
first reading means for simultaneously reading onto said bit lines the storage data of said preliminary memory cells of a single row connected to said preliminary word line; and
second reading means for simultaneously reading onto said bit lines the storage data of said memory cells of a single row connected to said word line.

20. The semiconductor memory device of claim 19, wherein said first reading means and said second reading means comprise means for amplifying a potential change on each of said bit lines, and wherein:

(i) a potential on said bit line connected to an arbitrary memory cell of said memory cells changes dependently on storage data of said arbitrary memory cell in response to activation of said word line connected to said arbitrary memory cell; and (ii) a potential on said bit line connected to an arbitrary preliminary memory cell of said preliminary memory cells changes dependently on storage data of said arbitrary preliminary memory cell in response to activation of said preliminary word line connected to said arbitrary preliminary memory cell.

21. The semiconductor memory device of claim 16 wherein said selecting means includes preliminary word line selecting signal outputting means responsive to said common address signal for outputting a preliminary word line selecting signal for selecting preliminary word lines, said preliminary word line selecting signal outputting means having means responsive to a first external address signal for outputting said preliminary word line selecting signal.

22. The semiconductor memory device of claim 21, wherein said enabling means includes preliminary word line activating signal applying means responsive to said preliminary word line selecting signal from said preliminary word line selecting signal outputting means and a second external address signal for applying, to one of said selected preliminary word lines corresponding to said second external address signal, and an activating signal for activating the corresponding preliminary word line.

23. The semiconductor memory device of claim 22 further comprising control means for controlling said selecting means and said enabling means to be enabled or disabled, said control means including first forcing means responsive to a first control signal for forcing an output of said preliminary word line selecting signal to a non-selecting signal for selecting none of said preliminary word lines.

* * * * *

UNITED STATES PATENT AND TRADEMARK OFFICE
CERTIFICATE OF CORRECTION

PATENT NO. : 5,903,575
DATED : May 11, 1999
INVENTOR(S) : Shigeru Kikuda

It is certified that error appears in the above-identified patent and that said Letters Patent is hereby corrected as shown below:

IN THE CLAIMS:

Column 35, line 60, in claim 15, change "of" (second occurrence) to --connected to--; and
Column 35, line 62, in claim 15, change "of" (first occurrence) to --connected to--.

Signed and Sealed this

Fourteenth Day of December, 1999

Attest:

Q. TODD DICKINSON

*Attesting Officer*      *Acting Commissioner of Patents and Trademarks*